United States Patent [19]
Yin

[11] Patent Number: 5,717,629
[45] Date of Patent: Feb. 10, 1998

[54] MEMORY CIRCUIT AND METHOD OF OPERATION THEREFOR

[76] Inventor: Ronald Loh-Hwa Yin, 547 Sullivan Dr., MountainView, Calif. 94041

[21] Appl. No.: 735,660

[22] Filed: Oct. 24, 1996

[51] Int. Cl.$^6$ .................................................. G11C 11/24
[52] U.S. Cl. .......................... 365/149; 365/175; 365/203; 365/230.03
[58] Field of Search ........................... 365/175, 149, 365/230.03, 203

[56] References Cited

U.S. PATENT DOCUMENTS

| | | | |
|---|---|---|---|
| 3,986,173 | 10/1976 | Baitinger et al. | 340/173 R |
| 4,247,918 | 1/1981 | Iwashashi et al. | 365/218 |
| 4,360,897 | 11/1982 | Lehovec . | |
| 4,573,143 | 2/1986 | Matsukawa . | |
| 4,920,513 | 4/1990 | Takeshita et al. | 365/175 |
| 5,483,482 | 1/1996 | Yamada et al. | 365/149 |
| 5,535,156 | 7/1996 | Levy et al. . | |
| 5,566,371 | 10/1996 | Ogawa | 365/230.03 |

OTHER PUBLICATIONS

"Pinch Load Resistors Shrink Bipolar Memory Cells" by S.K. Wiedmann, *Electronics*, Mar. 7, 1974, pp. 130–133.

*Primary Examiner*—Son T. Dinh

[57] ABSTRACT

A memory array circuit has a matrix of column lines and row lines. A plurality of storage capacitors are arranged in the matrix, with each storage capacitor having a data node and a voltage node. Each of the plurality of storage capacitors has an associated column line and an associated row line, with the voltage node connected to the associated row line. A diode connects the data node of a storage capacitor to its associated column line. A first decoder decodes a first address signal and selects one of the column lines. A second decoder decodes a second address signal, and generates a row output signal, with each row output signal of the second decoder having a corresponding row line. A plurality of voltage control circuits is provided with each voltage control circuit receiving one of the plurality of row output signals, and for applying a control signal to a corresponding row line, in response to a data read signal, a data write to one state signal or a data write to another state signal.

20 Claims, 6 Drawing Sheets

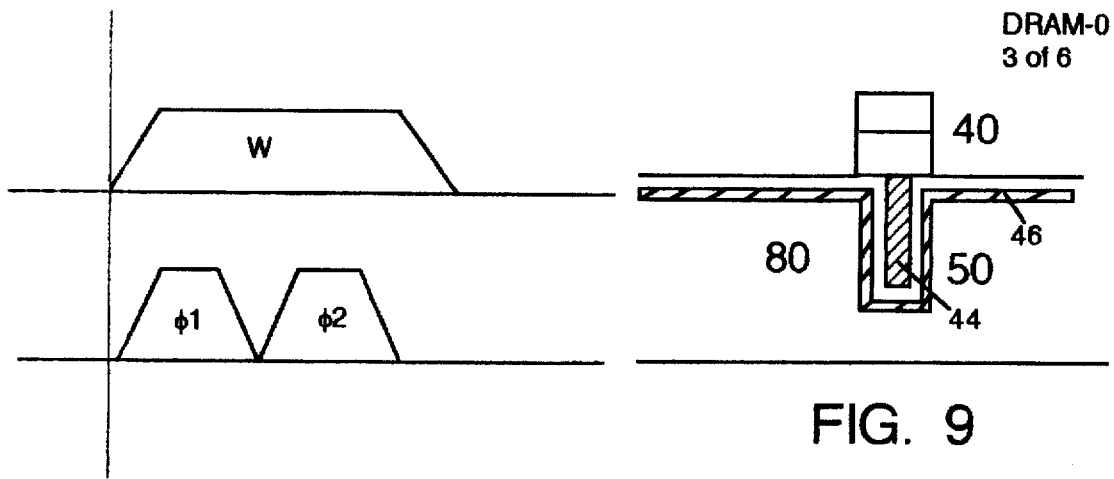
FIG. 6
FIG. 9
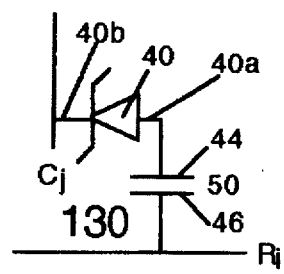
FIG. 8
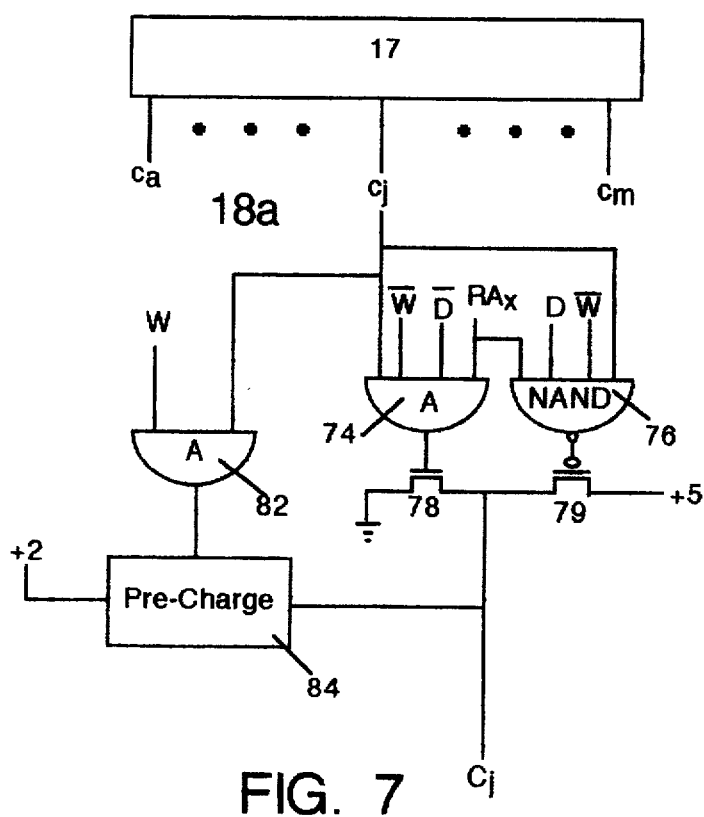
FIG. 7

MEMORY CIRCUIT AND METHOD OF OPERATION THEREFOR

TECHNICAL FIELD

The present invention relates to a semiconductor memory array circuit, and more particularly to a DRAM memory array circuit whose memory cells are arranged in a matrix of rows and columns, with diodes connecting the memory cells to the rows and columns to write data signals into or to read data signals out of a selected memory cell.

BACKGROUND OF THE INVENTION

Semiconductor memory array circuits are well known in the art. There are three types of memory cells which can electrically write data signals into a memory cell and electrically read data signals out of a selected memory cell.

The first type, using a capacitor, is called a Dynamic Random Access Memory (DRAM). The second type, using a latch, is called a Static Random Access Memory (SRAM). A third type using a floating gate to store charges, which controls the action of a channel of a transistor is called Electrically Erasable Programmable Read Only Memory (EEPROM).

In all three types of semiconductor memory array circuit, the memory cells are arranged in a matrix of columns and rows. A column line and a row line can select a particular select transistor which is connected to an associated memory cell. During writing, a data signal (which can be "1" or "0") to be stored in a selected memory cell is supplied on a column line. The activation of a particular row line, which is connected to the gate of a select transistor, causes the data signal to be passed through the select transistor associated with the select memory cell and to be stored in the select memory cell.

In a DRAM device the memory cell is a capacitor with one electrode of the capacitor connected to the selected transistor, and the other electrode of the capacitor connected to ground. The memory array is typically segmented into two sections. During read, the corresponding column lines of the two memory sections are pre-charged. The select capacitor in one memory section is connected to one pre-charged column line. A sense amplifier differentially senses the charges between the two pre-charged column lines.

In an SRAM device there are two column lines with two select transistors, causing the data signal and its complement to be stored in the latch. During read operation, a particular pair of column line is precharged. A particular row line is then activated turning on the pair of select transistors causing the state of the selected memory cell to be read out and supplied to the precharged column lines. The change on the charge of the pre-charged column lines from one another determines the state of the selected memory cell.

In U.S. Pat. No. 3,986,173 reference is made to the use of diodes to transfer data signals into a bipolar latch. However, the diodes were deemed not suitable and disclosure is made to the use of select transistors. In addition, that reference taught the use of tow column lines per latch. see also "Pinch Load resistors Shrink Bipolar Memory Cells" by S. K. Wiedmann, *Electronics*, Mar. 7, 1974, p. 130–133.

In a flash EEPROM, the charges stored on a floating gate of the selected transistor determines the amount of current that passes through the channel of the select transistor.

Semiconductor memory designers have sought to increase the density of semiconductor memory array circuit, by packing more memory cells in each integrated circuit. This has been accomplished primarily by reducing the size of the transistors which are used in the memory array circuit. However, each transistor is fabricated laterally or planarly on a semiconductor substrate, such as single crystalline silicon. Thus, select transistors take up lateral surface area on a semiconductor substrate.

Control circuits interfacing a row decoder and row lines for controlling the voltages applied to the row lines during read, erase, and program in an EEPROM device is also well known in the art. See for example, U.S. Pat. No. 4,427,918.

SUMMARY OF THE INVENTION

The present invention comprises an arrangement of a plurality of first lines (such as column lines) and a plurality of second lines (such as row lines). The plurality of first lines and plurality of second lines define a matrix. A plurality of storage cells are arranged in the matrix, with each storage cell having a data node and a voltage node. Each of the plurality of storage cells has an associated first line and an associated second line, with the voltage node connected to the associated second line. A diode connects the data node of a storage cell to its associated first line. A first decoder decodes a first address signal and selects one of the first lines. A second decoder decodes a second address signal, and generates an output signal, with each output signal of the second decoder having a corresponding second line. A plurality of voltage control circuits is provided with each voltage control circuit receiving one of the plurality of output signals, and for applying a control signal to the corresponding second line, in response to a data read signal, a data write to one state signal or a data write to another state signal.

BRIEF DESCRIPTION OF THE DRAWINGS

FIG. 6 is a timing diagram during the read operation of the embodiment of the memory array circuit shown in FIG. 1.

FIG. 7 is a circuit diagram of a portion of a column decoder suitable for use in the first embodiment of the memory array circuit shown in FIG. 1.

FIG. 8 is a circuit diagram of a second embodiment of a DRAM memory unit for use in the embodiments of the memory array circuit of the present invention shown in FIGS. 1 and 10.

FIG. 9 is a cross sectional view of the construction of the first or second embodiment of the DRAM memory unit of FIGS. 2 or 8 in a semiconductor substrate.

DETAILED DESCRIPTION OF THE DRAWINGS

First Embodiment of a Memory Array Circuit

Figure 1:
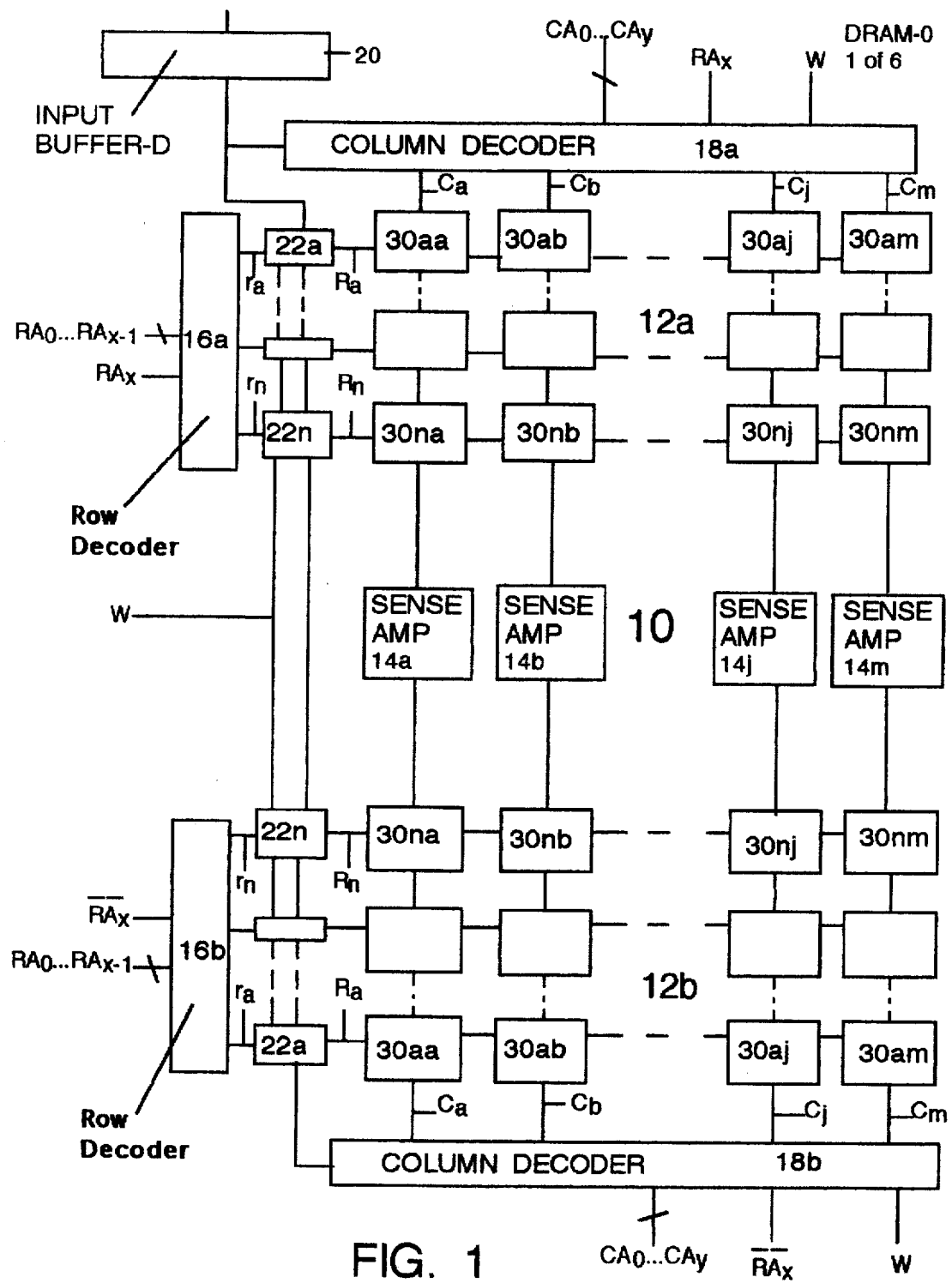
FIG. 1 is a schematic block level diagram of a first embodiment of a memory array circuit of the present invention, suitable for use with DRAM memory units, comprising DRAM cells.
Figure 2:
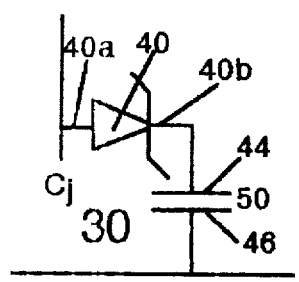
FIG. 2 is a circuit diagram of a first embodiment of a DRAM memory unit for use in the embodiments of the memory array circuit of the present invention shown in FIGS. 1 and 10.
Figure 14:
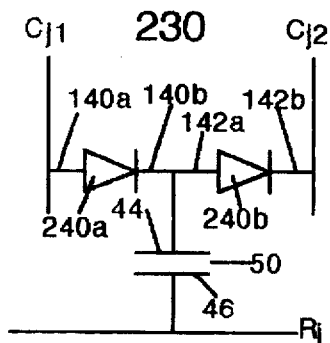
FIG. 14 is a circuit diagram of a third embodiment of a DRAM memory unit for use in the third embodiment of the memory array circuit shown in FIG. 13.

Referring to FIG. 1 there is shown a block diagram of a first embodiment of a semiconductor memory array circuit 10 of the present invention. The circuit 10 comprises two sections of memory units: first memory section 12a and second memory section 12b. The first memory section 12a comprises a plurality of data memory units 30aa ... 30nm arranged in a plurality of n rows and a plurality of m columns, connected by a plurality of n row lines $R_a ... R_n$ and a plurality of m column lines $C_a ... C_m$. The second memory section 12b also comprises a plurality of data memory units 30aa ... 30nm also arranged in a plurality of n rows and a plurality of m columns, connected by a plurality of n row lines $R_a ... R_n$, and a plurality of m column lines $C_a ... C_m$. Each of the memory units 30 comprises a DRAM capacitor 50 (which is shown in FIGS. 2, 8 or 14).

A sense amplifier 14 connects each column line, e.g. $C_j$, of the first memory section 12a to a corresponding column line, e.g. $C_j$, of the second memory section 12b. The sense amplifier 14, e.g. $14_j$, differentially senses the charges on a column line, e.g. $C_j$, of the first memory section 12a, caused by a data memory unit 30, e.g. any of the memory units 30aj ... 30nj, of the first memory section 12a being connected thereto, with the charges on a corresponding column line $C_j$, of the second memory section 12b. The output of each sense amplifier 14 is supplied to an output buffer (not shown).

Within the first memory section 12a, the circuit 10 comprises a first row decoder 16a for receiving and decoding a row address signal $RA_0 ... RA_{(x-1)}$. The first row decoder 16a also receives the row address signal $RA_x$. In accordance with industry standard, the row address signals $RA_0 ... RA_x$ can be the address signals $A_0 ... A_x$ supplied to the array circuit 10 strobed by a control signal RAS. The first row decoder 16a decodes the row address signal $RA_0 ... RA_{(x-1)}$, if the row address signal $RA_x$ is high. The output of the first row decoder 16a is a plurality of row output signals, $r_a ... r_n$. Each of the row output signals, $r_a ... r_n$, is supplied to a respective control circuit 22a ... 22n and has a corresponding row line $R_a ... R_n$. Each of the control circuits 22 receives one of the row output signals $r_a ... r_n$ and the read/write signal W and the state of the input signal D, and in response thereto, supplies an appropriate control signal to its corresponding row line $R_a ... R_n$. The read/write signal W is an active low write signal. Thus, W high indicates active read.

Within the second memory section 12b, the circuit 10 comprises a second row decoder 16b for receiving and decoding the row address signal $RA_0 ... RA_{(x-1)}$, which is the same row address signal supplied to the first row decoder 16a. The second row decoder 16b also receives the row address signal $\overline{RA_x}$. The second row decoder 16b decodes the row address signal $RA_0 ... RA_{(x-1)}$, if the row address signal $\overline{RA_x}$ is high. Thus, although the same row address signal $RA_0 ... RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b generates a plurality of row output signals, $r_a ... r_n$, in response to the row address signal $RA_0 ... RA_{(x-1)}$. Each of the row output signals $r_a ... r_n$ of the second decoder 16b is supplied to a respective control circuit 22a ... 22n and has a corresponding row line $R_a ... R_n$. Each of the control circuits 22 receives one of the row output signals $r_a ... r_n$ and the read/write signal W and the state of the input signal D, and in response thereto supplies an appropriate control signal to its corresponding row line $R_a ... R_n$.

Within the first memory section 12a, the circuit 10 comprises a first column decoder 18a. The first column decoder 18a receives the column address signal $CA_0 ... CA_y$, which in accordance with industry standard can be the address signals $A_0 ... A_y$ supplied to the array circuit 10 strobed by a control signal CAS. The first decoder 18a also receives the row address signal $RA_x$ and the read/write signal w. In response, the first column decoder 18a selects one of the column lines $C_a ... C_m$ of the first memory section 12a. The first column decoder 18a is activated if the read/write signal W is high (indicating a read operation), or if the signal $RA_x$ is high.

Within the second memory section 12b, the circuit 10 comprises a second column decoder 18b. The second column decoder 18b receives the same column address signal $CA_0 ... CA_y$, as received by the first column decoder 18a, and the row address signal $\overline{RA_x}$ and the same read/write signal W. In response, the second column decoder 18b selects one of the column lines $C_a ... C_m$ of the second memory section 12b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column signal $CA_0 ... CA_y$, the same column line $C_j$ will be chosen, causing the sense amp $14_j$ to sense differentially the charges on the column line $C_j$ of the first memory section 12a from the column line $C_j$ of the second memory section 12b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 12a. If $\overline{RA_x}$ is high, then only second column decoder 18b and only second row decoder 16b will be active, thereby activating only the column and row lines of the second memory section 12b.

The array 10 also comprises a conventional input buffer 20 for receiving a data signal D that is to be stored in one of the plurality of memory units 30aa ... 30nj of either the first memory section 12a or the second memory section 12b. The input signal D is supplied to each of the control circuits 22. Finally, the circuit 10 receives the read/write signal W, which is also supplied to each of the control circuits 22.

First Embodiment of A Memory Unit

Referring to FIG. 2, there is shown a memory unit 30 suitable for use with the memory array circuit 10. The memory unit 30 comprises a DRAM capacitor 50. The capacitor 50 has a first electrode 44 and a second electrode 46. As is well known in the art, a capacitor 50 stores charges between the electrodes 44 and 46, and is a volatile storage device. The second electrode 46 is connected to the associated row line $R_i$.

The memory unit 30 also comprises an avalanche diode 40, which has an anode 40a and a cathode 40b. As used herein, the term avalanche diode shall include zener diode or any other form of diode that has both a forward bias conduction state, and a reverse bias breakdown conduction state. The anode 40a is connected to the associated column line $C_j$. The cathode 40b is connected to the first electrode 44. The avalanche diode 40 can be made out of polysilicon and can be placed above the silicon substrate 80. Alternatively, the avalanche diode 40 can be fabricated in the semiconductor substrate 80 with the capacitor 50 thereby fabricated "above" the diode 40.

The principle of operation for writing (state "1", hereinafter described as program operation; and state "0", hereinafter described as erase operation) into the memory unit 30 is that it depends upon the voltage differential between the selected column line $C_j$, and the selected row line $R_i$ to cause either a forward conduction of the avalanche diode 40 or a reverse conduction of the avalanche diode 40. Thus, the control circuit 22 supplies a voltage to the select row line $R_i$ to cause a program or erase operation, depending upon the voltage that is applied to the selected column line $C_j$. Furthermore, the principle of operation for reading the state of the memory unit 30 also depends upon the voltage precharged on the selected column line $C_j$ and the voltage applied to the selected row line $R_i$ to cause a conduction of the avalanche diode 40, depending upon the charges stored on the capacitor 50.

Figure 3:
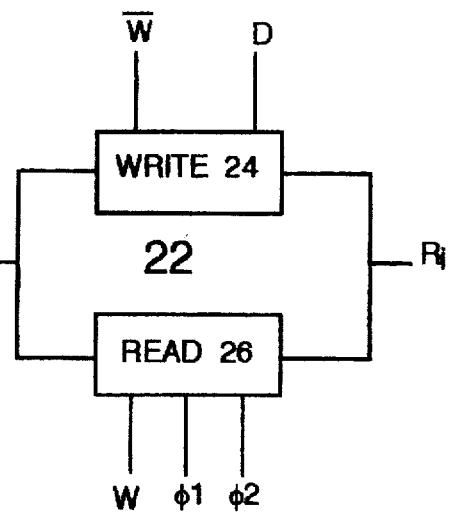
FIG. 3 is a block level diagram of a first embodiment of a control circuit suitable for use in the first embodiment of the memory array circuit shown in FIG. 1.
Figure 5:
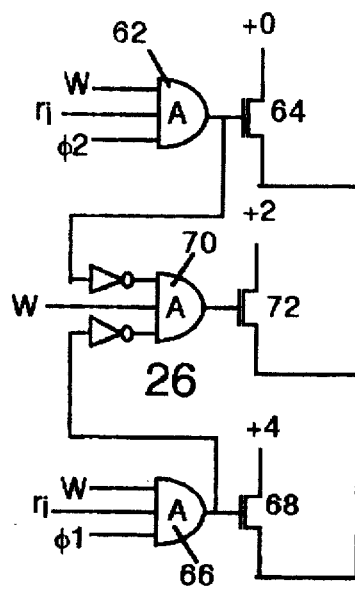
FIG. 5 is a circuit diagram of a read circuit suitable for use in the first embodiment of the control circuit shown in FIG. 3.

Therefore, as shown in FIG. 3, the control circuit 22 comprises generally, a write circuit 24 for applying a voltage to the selected row line $R_i$ during write operation, and a read circuit 26 for applying a voltage to the selected row line $R_i$ during read operation. The write circuit 24 and the read circuit 26 are shown in greater detail in FIGS. 4 and 5 respectively. However, based upon the previous discussion, for both read and write operation, the embodiment of the write circuit 24 and the read circuit 26 is only one of many possible embodiments depending upon the voltage of the selected column line $C_j$. Furthermore, for purpose of this discussion, the avalanche diode 40 is assumed to have a forward bias threshold voltage of +0.5v and a reverse breakdown voltage of −5.0 volts. For the purpose of describing the embodiment of the control circuit 22 shown in FIG. 3, the following voltages are assumed.

|  | $C_j$ | $C_i$ | $R_i$ | $R_j$ |
| --- | --- | --- | --- | --- |
| Program | 5 | f | 0 | 5 |
| Erase | 0 | f | 5 | 0 |
| Read | 2 | f | $\phi 14$ | 2 |
|  |  |  | $\phi 20$ |  | where program is to write a data signal of "high" or "1" into a select capacitor 50 defined at the intersection of column line $C_j$ and row line $R_i$. Erase is to write a data signal of "low" or "0" into a select capacitor 50 defined at the intersection of column line $C_j$ and row line $R_i$. Read is to read the state of the data signal stored in the select capacitor 50 defined at the intersection of column line $C_j$ and row line $R_i$. $C_i$ is an unselected column line. f is floating. $R_j$ is an unselected row line.

The voltages shown above also assume that the unselected column lines, e.g. $C_i$, are sufficiently insulated from the selected column line $C_j$ so that the unselected column lines may be maintained at a floating state. As for the unselected row line $R_j$, a voltage is applied thereto (and not maintained at floating) because typically row lines are made as diffusion lines on a substrate 80, presenting potential write disturbance conditions. However, if the row lines are fabricated sufficiently insulated from one another, e.g. by Silicon On Sapphire technology, then the unselected row lines can be maintained at floating.

Figure 4:
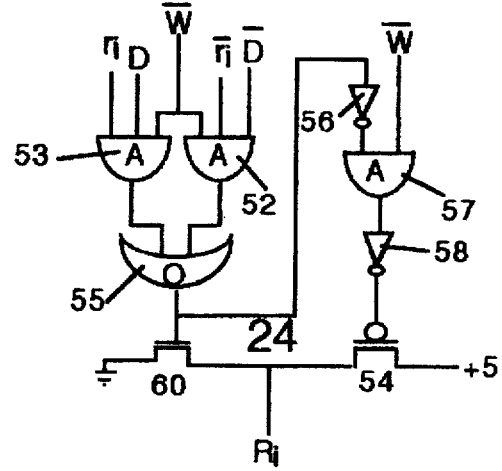
FIG. 4 is a circuit diagram of a write circuit suitable for use in the embodiments of the control circuit shown in FIGS. 3 and 11.

The write circuit 24 is shown in greater detail in FIG. 4. The write circuit 24 receives a row output signal $r_i$, which is the output of the row decoder 16a or 16b. The row output signal $r_i$ is supplied to an AND gate 53, to which the read/write signal $\overline{W}$, and the input signal D are also supplied. The output of the AND gate 53 is supplied to an OR gate 55. The complement row output signal $\overline{r_i}$ is supplied to an AND gate 52, to which the read/write signal $\overline{W}$, and the input signal $\overline{D}$ are also supplied. The output of the AND gate 52 is supplied to the OR gate 55. The output of the OR gate 55 is supplied to the gate of an N type enhancement MOS transistor 60. One of the source/drain regions of the transistor 60 is supplied to ground. The other drain/source region of the transistor 60 is connected to the row line $R_i$.

The output of the OR gate 55 is inverted by an invertor 56, whose output is supplied as an input to AND gate 57. Another input to AND gate 57 is the read/write signal $\overline{W}$. The output of the AND gate 57 is inverted by invertor 58, and is then supplied to the gate of a P type enhancement MOS transistor 54. One of the source/drain regions of the transistor 54 is connected to +5 volts. The other drain/source region of the transistor 54 is connected to the row line $R_i$.

The read circuit 26 comprises an AND gate 62 which receives as its input the row output signal $r_i$, the read/write signal W, and the second clock signal $\phi 2$. The output of the AND gate 62 is connected to the gate of transistor 64. Transistor 64 has its source connected to zero volts, with the drain connected to the row line $R_i$. The read circuit 26 also comprises an AND gate 66 which receives as its input the row output signal $r_i$, the read/write signal W, and the first clock signal $\phi 1$. The output of the AND gate 66 is connected to the gate of transistor 68. Transistor 68 has its source connected to +4 volts, with the drain connected to the row line $R_i$. The read circuit 26 finally comprises an AND gate 70 which receives as its input the inverse of the outputs of the AND gates 62 and 66, and the read/write signal W. The output of the AND gate 70 is connected to the gate of transistor 72. Transistor 72 has its source connected to +2 volts, with the drain connected to the row line $R_i$.

A portion of the column decoder 18a, which can supply the necessary voltages described above, is shown in greater detail in FIG. 7. The column decoder 18a comprises a conventional column decoder 17, having column output signals $c_a \ldots c_m$. Each column output signal, e.g. $c_j$ is supplied to a first AND gate 74 and a NAND gate 76. The other inputs to the first AND gate 74 are the read/write signal $\overline{W}$, the input data signal $\overline{D}$, and for the first memory section 12a, the row address signal $RA_x$. The other inputs to the NAND gate 76 are the read/write signal $\overline{W}$, the input data signal D, and for the first memory section 12a, the row address $RA_x$.

The output of the first AND gate 74 is supplied to the gate of a transistor 78. The drain of the transistor 78 is connected to the column line $C_j$. The source of the transistor 78 is connected to ground. The output of the NAND gate 76 is supplied to the gate of a PMOS transistor 79. One of the drain/source regions of the transistor 79 is connected to the column line $C_j$. The other drain/source region of the transistor 79 is connected to +5 volts.

Finally, the column output signal $c_j$ is supplied to a second AND gate 82 to which the read/write signal W is also supplied. The output of the second AND gate 82 is used to activate a pre-charge circuit 84. The pre-charge circuit 84 is of conventional design, with one end connected to a +2 volt source, and the other end connected to the column line $C_j$. It can be as simple as a transistor.

A cross sectional view of the DRAM cell 50 and the diode 40 as constructed in a semiconductor substrate 80 is shown in FIG. 9. The capacitor 50 is shown as a conventional trench type capacitor 50, with the second electrode 46 as a diffusion line in the substrate 80. The avalanche diode 40 is shown as being made of polysilicon doped with appropriate dopants to form a PN junction. The diode 40 is formed in a polysilicon layer which is positioned "above" the capacitor 50.

Writing

The writing of the memory array circuit 10 with the DRAM cell 50 to a state of "1" or the storage of charges on the capacitor 50 is as follows. The DRAM capacitor 50 is assumed to have either a charge of +4.5 volts (representing a state of "1") or a charge of 0.0 volts (representing a state of "0").

If a state of "1" is to be programmed into the DRAM cell 50 defined by the intersection of column line $C_j$ and row line $R_i$, then the conventional column decoder 17 will generate a high column output signal $c_j$. For a write operation the read/write signal $\overline{W}$ will be high. When the appropriate memory section 12a or 12b is selected then either $RA_x$ or $\overline{RA}_x$ will be on. This will be AND gated with the selected column output signal $c_j$, resulting in a low signal supplied to the gate of PMOS transistor 79, to connect column line $C_j$ to +5 volts. The unselected column output signals, e.g. $c_a$, will be low, resulting in the output of AND gate 74 and NAND gate 76 being low and high respectively. This is not sufficient to turn on either transistor 78 or 79, thereby keeping the corresponding unselected column lines, e.g. $C_a$ floating.

The appropriate row decoder 16a or 16b will be selected. All of the unselected row output signals $r_a \ldots r_{(i-1)} r_{(i+1)} \ldots r_n$ will be low. AND gates 52 and 53 of the write circuit 24 of each control circuit 22 will be turned off. However, the output of the OR gate 55 is inverted by invertor 56 which together with read/write signal $\overline{W}$ turns on transistor 54, which connects the corresponding unselected row line $R_a$ to +5 volts. Therefore, the unselected row line $R_a$ will be high.

For the selected row output signal, e.g. $r_i$, it would be high. Thus, the output of AND gate 53 is high. This results in the connection of the selected row line $R_i$ to ground.

Therefore, to program or to write a state of "1", the voltages for the selected memory unit $30ij$ is as follows: $C_j$ is at 5 volts, $R_i$ is at 0 volts. This causes the diode 40 to forward conduct, resulting in 4.5 volts being placed on capacitor 50. When the voltages are removed from the column line $C_j$ and row line $R_i$ the capacitor 50 would have stored thereon a voltage differential of 4.5 volts between the first and the second electrodes 44 and 46 respectively.

If a state of "0" is to be written into the DRAM cell 50 defined by the intersection of column line $C_j$ and row line $R_i$, then the column decoder 17 will generate a high column output signal $c_j$. Since $\overline{D}$ will be high, AND gate 74 will turn on transistor 78, connecting the column line $C_j$ to ground or 0 volts. All unselected column lines $C_a \ldots C_{(j-1)} C_{(j+1)} \ldots C_m$ are floating.

For an erase condition, the data signal $\overline{D}$ will be high. The row output signal $r_i$ will be high. Finally, the read/write signal $\overline{W}$ will also be high. This causes AND gates 52 and 53 to output low, which ultimately causes the transistor 54 to turn on, thereby connecting $R_i$ to +5 volts. All unselected row output signals $r_a \ldots r_{(i-1)} r_{(i+1)} \ldots r_n$ will be at ground, causing the respective AND gate 52 to be at high, turning on transistor 60. This connects the unselected row lines $R_a \ldots R_{(i-1)} R \ldots R_n$ to ground.

Raising the row line $R_i$ to +5.0 volts causes the second electrode 46 to be at +5.0 volts. If the voltage at first electrode 44 is at ground, or a zero voltage differential is between the first electrode 44 and the second electrode 46, then this will cause the voltage on the first electrode 44 to be raised to +5.0 volts. With the first electrode at +5.0 volts, the diode 40 will barely reverse conduct if at all.

If the first electrode 44 is at +4.5 volts, then raising the second electrode 46 to +5.0 volts causes the first electrode 44 to be raised to +9.5 volts. This is greater than the reverse bias voltage for the diode 40. Diode 40 would turn on until the voltage at the first electrode 44 drops to a voltage on the order of +5.0 volts. Once the first electrode 44 is at a voltage potential on the order of +5.0 volts, the voltage differential between the first electrode 44 and the second electrode 46 becomes negligible.

Write Disturbance

In the write "1" operation, where +5 volts is applied to the selected column line $C_j$, write disturbance on the capacitor 50 in the same row is minimized by keeping the unselected column lines $C_a \ldots C_{(j-1)} C_{(j+1)} \ldots C_m$ at floating, and sufficiently insulated from the selected column line $C_j$. For the capacitors 50 in the same column, but in different rows, write disturbance is minimized by keeping the unselected row lines $R_a \ldots R_{(i-1)} R_{(i+1)} \ldots R_n$ at +5 volts, resulting in almost zero voltage differential between the selected column line $C_j$ and the unselected row line.

In the write "0" operation, where +0 volts is applied to the selected column line $C_j$, the diode 40 prevents any voltage on the first electrode 44 of the memory cells in the same column but at different rows, from being passed through the diode 40, so long as the unselected row lines $R_a \ldots R_{(i-1)} R_{(i+1)} \ldots R_n$ are also maintained at ground.

As previously stated, during the write operation, the voltage applied to the selected row line $R_i$ depends upon the voltage applied to the selected column line $C_j$. Thus, the following voltages are also possible.

|  | $C_j$ | $C_i$ | $R_i$ | $R_j$ |
|---|---|---|---|---|
| Program | 0 | f | −5 | 0 |
| Erase | 0 | f | 5 | 0 |

The choice of the voltages to be applied to the selected column line $C_j$ and the selected row line $R_i$ depends on the voltage differential between the selected column line $C_j$ and the selected row line $R_i$. Therefore, it may be desirable to use the foregoing voltages, because during program and erase, the voltage applied to the unselected row lines $R_a \ldots R_{(i-1)} R_{(i+1)} \ldots R_n$, which are far more numerous than the selected row line $R_i$, are maintained at ground. This would minimize power consumption. However, this would necessitate a source of negative voltage.

Furthermore, if it is difficult to maintain sufficient insulation between adjacent column lines to keep the unselected column lines floating, by changing the characteristics of the write voltage, and the forward and reverse conduction conditions of the avalanche diode 40, it is possible to apply a voltage to the unselected column lines and still have little or no write disturbance. For example, if the program voltage is +4.5 volts (same as before), and the erase voltage is 0.0 volts (same as before), and the forward conduction of the avalanche diode 40 is +0.5 volts (same as before), but the reverse conduction voltage is −10.0 volts, then the following voltages can be used during the write operation:

|  | $C_j$ | $C_i$ | $R_i$ | $R_j$ |
|---|---|---|---|---|
| Program | 5 | 0 | 0 | 5 |
| Erase | −5 | 0 | 5 | 0 |

In the program operation, with the selected column $C_j$ at 5.0 volts, and the selected row $R_i$ at 0.0 volts, the associated diode 40 is in a forward conduct state and +4.5 volts is stored in the capacitor 50. The unselected rows $R_i$ are maintained at +5.0 volts, which is the same voltage as the voltage on the selected column $C_j$, resulting in no conduction (forward or reverse) of the diodes 40 associated with the unselected rows, in the selected column.

In the program operation, in the unselected columns $C_i$, the selected row $R_i$ is at 0.0 volts, which is the same voltage as the voltage on the unselected columns $C_i$ resulting in no conduction (forward or reverse) of the diodes 40 associated with the unselected row. In the unselected rows $R_j$, there are two possibilities depending upon the state of the capacitor 50 associated with the unselected rows $R_j$. If the capacitor 50 is erased, the voltage differential between the unselected column $C_i$ and the first electrode 44 of the capacitor 50 is −5.0 volts which is insufficient to cause reverse conduction of the associated diode 40. If the capacitor 50 is programmed, then the voltage differential between the unselected column $C_i$ and the first electrode 44 of the capacitor 50 is −9.5 volts which is also insufficient to cause reverse conduction of the associated diode 40. In either case, the associated diode 40 would not conduct.

In the erase operation, with the selected column $C_j$ at −5.0 volts and the selected row $R_i$ at 5.0 volts, this causes the associated diode 40 to reverse conduct until the first electrode 44 of the selected capacitor 50 is at 5.0 volts or zero voltage differential with respect to the selected row $R_i$. For the unselected rows $R_j$, there are two possibilities. If the associated capacitor 50 is erased, the first electrode 44 would be at 0.0 volts. This is a reverse bias of −5.0 volts, which is insufficient to cause reverse conduction of the associated diode 40. If the associated capacitor 50 is programmed, the first electrode 44 would be at +4.5 volts. This is a reverse bias of −9.5 volts, which is also insufficient to cause reverse conduction of the associated diode 40. Therefore, the diodes 40 associated with the unselected rows $R_j$ would not conduct.

In the erase operation, in the unselected columns $C_i$, the unselected rows $R_j$ are at 0.0 volts, which is the same as the unselected columns. Thus, the diodes 40 associated with the unselected rows would not conduct. For the diodes 40 associated with the selected row $R_i$, there are two possibilities. If the associated capacitor 50 is erased, the first electrode 44 would be at 5.0 volts. This is a reverse bias of −5.0 volts, which is insufficient to cause reverse conduction of the associated diode 40. If the associated capacitor 50 is programmed, the first electrode 44 would be at +9.5 volts. This is a reverse bias of −9.5 volts, which is also insufficient to cause reverse conduction of the associated diode 40. Therefore, the diodes 40 associated with the selected row $R_i$ would also not conduct.

Reading

The discussion which follows assumes the conditions for the avalanche diode 40 discussed previously, i.e. forward conduction of +0.5 volts, and reverse conduction of −5.0 volts. To read a select memory cell 50, assume that the memory cell 50$ij$ is from the first memory section 12$a$. In that event row address signal $RA_x$ is high. In addition, for a read operation the read/write signal W is also high. The same select column line, e.g. $C_j$, of both memory sections 12$a$ and 12$b$ are first pre-charged. This can be done for example by applying a voltage source (+2 volts) to the selected column line $C_j$ of the first memory section 12$a$ and the selected column line $C_j$ of the second memory section 12$b$, and equilibrating the two, i.e. connecting them together momentarily, then disconnecting the voltage source, and then maintaining the column lines $C_j$ of both memory sections 12$a$ and 12$b$ at floating.

The read operation has several phases, marked by the clock signals $\phi 1$ and $\phi 2$. During the phase of pre-charging the selected column line $C_j$, all of the row lines, including the selected row line $R_i$ are maintained at +2 volts, so that no voltage differential exists between the selected column line $C_j$ and any of the row lines. In this manner, none of the diodes 40 is in a conduction mode, so that charges on the select column line $C_j$ are not disturbed. When the read operation commences, first clock signal $\phi 1$ is active. For the selected row output signal $r_i$, this causes AND gate 66 to be high, turning on transistor 68, raising row line $R_i$ to +4 volts. For the unselected row output signals $r_a \ldots r_{i-1}, r_{i+1} \ldots r_n$, these are low causing AND gate 70 to be high, turning on transistor 72, and causing the corresponding row line $R_a \ldots R_{i-1}, R_{i+1} \ldots R_n$ continue to be maintained at +2 volts.

After the transistor 68 is turned on for the duration that first clock signal $\phi 1$ is on, second clock signal $\phi 2$ is activated. For the selected row output signal $r_i$, this causes AND gate 62 to be high, turning on transistor 64, connecting row line $R_i$ to ground. For the unselected row output signals $r_a \ldots r_{i-1}, r_{i+1} \ldots r_n$, during clock signal $\phi 2$, these continue to be low causing AND gate 70 to be high, turning on transistor 72, and causing the corresponding row line $R_a \ldots R_{i-1}, R_{i+1} \ldots R_n$ to continue to be maintained at +2 volts.

If the select capacitor 50 in first memory section 12$a$ is written to "0", i.e. with zero volts on the first electrode 44, raising the voltage on the row line $R_i$ to +4 volts during the first clock signal $\phi 1$ would cause the diode 40 to be in a reverse bias mode. However, that voltage differential is only two volts and is not sufficient to cause the diode 40 to be in a reverse conduction state. Thereafter, during the second clock signal phase $\phi 2$, lowering the voltage on the row line $R_i$ to ground would cause the diode 40 to be in a forward conduction state, reducing the amount of charge precharged on the column line $C_j$. Thus, during the first clock signal $\phi 1$, there would not be any change to the charges on the select column line $C_j$, but there would be a removal of a certain amount of charges thereafter during the second clock signal $\phi 2$.

If the select capacitor 50 in first memory section 12$a$ is set to "1", i.e. with +4.5 volts on the first electrode 44, raising the voltage on the row line $R_i$ to +4 volts, during the first clock signal $\phi 1$, would cause the diode 40 to be at +8.5 volts, which is +6.5 volts greater than the precharged column line $C_j$. This would cause the diode 40 to be in a reverse conduction state, causing charges from the capacitor 50 to be added to the charges on the select column line $C_j$, until the first electrode 44 of the capacitor 50 is discharged to approximately +7.0 volts, which is +5 volts greater than the pre-charged column line $C_j$. At this point the reverse conduction would cease. Thereafter, during the second clock signal phase φ2, lowering the voltage on the row line $R_i$ to ground would cause the voltage on the electrode 44 to be at +3 volts. This would not cause any change to the charges on the select column line $C_j$.

In summary, if the select capacitor 50 has a "1" state, then during clock signal φ1, charges would be added to the select pre-charged column line $C_j$. If the select capacitor 50 has a "0" state, then during clock signal φ2, charges would be removed from the select pre-charged column line $C_j$.

The amount of charge on the column line $C_j$ connecting to the selected memory cell 50 in the selected memory section 12a is compared to the amount of charge on the corresponding column line $C_j$ in the unselected memory section 12b. The differential sensing of the two column lines $C_j$ determines the state of the selected memory cell 50.

The voltages applied during the clock signals φ1 and φ2 can also be reversed. Thus, during the clock signal φ1, +0 volts can be applied to the select row line $R_i$ with +4 volts applied to the select row line $R_i$ during clock signal φ2. In that event, during clock signal φ1, if the select capacitor has stored a "0" state, then charges would be removed from the select pre-charged column line $C_j$. During clock signal φ2, if the select capacitor has stored a "1" state, charges would be added to the select pre-charged column line $C_j$.

Finally, similar to the foregoing discussion regarding other combination of voltages that can be applied during the write operation, the following voltages are also possible during the read operation.

|      | $C_j$ | $C_i$ | $R_i$         | $R_j$ |
|------|-------|-------|---------------|-------|
| Read | 0     | f     | φ1 +2<br>φ2 −2 | 0     |

Again, the advantage is that the voltage applied to the unselected row lines $R_a \ldots R_{(i-1)},R_{(i+1)} \ldots R_n$, which are far more numerous than the selected row line $R_i$, are maintained at ground.

Second Embodiment of A Memory Unit

An alternative to the first embodiment of the memory unit 30 suitable for use in the memory array 10 is shown in FIG. 8. In the alternative embodiment, the memory unit 130 is similar to the memory unit 30. Therefore, like numerals will be used to designated identical parts. The memory unit 130 comprises a memory capacitor 50 and an avalanche diode 40 having an anode 40a and cathode 40b. The only difference from the memory unit 30 is that the anode 40a is connected to the first electrode 44 and the cathode 40b is connected to the column line $C_j$. In this embodiment, "1" is +5 volts, "0" is 0 volts. The diode 40 is assumed to have the same threshold voltage, and reverse conduction characteristics as that for the embodiment shown in FIG. 2. The following voltages are assumed for writing and reading.

|         | $C_j$ | $C_i$ | $R_i$           | $R_j$ |
|---------|-------|-------|-----------------|-------|
| Program | 0     | f     | −10.0           | −4.8  |
| Erase   | 0     | f     | 0.5             | −4.8  |
| Read    | 2     | f     | φ1 0.0<br>φ2−5.0 | −2.8  |

Writing

To write "1", or to program, the column line $C_j$ is held at ground, and the selected row line $R_i$ is brought to −10.0 volts. This causes the diode 40 to reverse conduct, causing −5 volts to be stored on the first electrode 44, which is a differential of +5 volts from the selected row line $R_i$. The unselected column lines $C_a \ldots C_{(j-1)}C_{(j+1)} \ldots C_m$ are held at floating. The unselected row lines $R_a \ldots R_{(i-1)},R_{(i+1)} \ldots R_n$ are held at −4.8 volts. Thus, for the unselected capacitors 50 in the unselected row $R_a$ but in the selected column $C_j$, the first electrode 44 would have either −4.8 volts (if the capacitor 50 were erased) or +0.2 volts (if the capacitor 50 were programmed). Neither voltage condition is sufficient to cause the associated diode 40 to conduct.

To write "0", or to erase, the select column line $C_j$ is brought to 0 volts. The select row line $R_i$ is brought to +0.5 volts. This is sufficient to cause the diode 40 to forward conduct, if the select capacitor had charges stored thereon. The select capacitor 50 would conduct until there is 0.5 volts on the first electrode 44. The unselected column lines $C_a \ldots C_{(j-1)}C_{(j+1)} \ldots C_m$ are held floating. The unselected row lines $R_a \ldots R_{(i-1)} R_{(i+1)} \ldots R_n$ are held at −4.8 volts. Similar to program operation, for the unselected capacitors 50 in the unselected row $R_a$ but in the selected column $C_j$, the first electrode 44 would have either −4.8 volts (if the capacitor 50 were erased) or +0.2 volts (if the capacitor 50 were programmed). Neither voltage condition is sufficient to cause the associated diode 40 to conduct.

Write Disturbance

The analysis for write disturbance for the embodiment of the memory unit 130 is similar to the discussion for the embodiment of the memory unit 30. In addition, similar to the discussion for the memory unit 30 to minimize power consumption, the following voltages can be applied.

|         | $C_j$ | $C_i$ | $R_i$ | $R_j$ |
|---------|-------|-------|-------|-------|
| Program | 4.8   | f     | −5.2  | 0     |
| Erase   | 4.8   | f     | +5.3  | 0     |

As discussed previously in the section on Write Disturbance of the first embodiment of the memory unit 30, the write voltage, and the forward and reverse conduction voltages for the diode 40 can be adjusted so that a voltage can be applied to the unselected columns $C_i$ to minimize the write disturbance. Thus, if the program voltage is +5.0 volts, erase voltage is 0.0 volts, and the forward conduction voltage of the diode 40 is +0.5 volts, all same as before, but the reverse conduction voltage for the diode 40 is −10.0 volts, then the following voltages can be applied.

|         | $C_j$ | $C_i$ | $R_i$ | $R_j$ |
|---------|-------|-------|-------|-------|
| Program | 5.0   | −0.2  | −10   | −4.8  |
| Erase   | 0.0   | 5.0   | +0.5  | −4.5  |

In the program operation, with the select column $C_j$ at +5.0 volts and the select row $R_i$ at −10.0 volts, the associated diode 40 would reverse conduct leaving −5.0 volts on the first electrode 44, or a differential of +5.0 volts from the select row $R_i$. For the unselected rows $R_j$ which are maintained at −4.8 volts, the first electrode of the associated capacitors 50 can have one of two possible states. If the associated capacitor 50 is erased, then the first electrode 44 would be at −4.8 volts, which is at a reverse bias of −9.8 volts, which is insufficient to cause the associated diode 40 to reverse conduct. If the associated capacitor 50 is programmed, then the first electrode 44 would be at +0.2 volts, which is also insufficient to cause the associated diode 40 to conduct. Thus, the diodes 40 of the unselected rows $R_j$ would not conduct.

In the program operation, with the unselect columns $C_i$ at −0.2 volts, and the select row $R_i$ at −10.0 volts, even if the associated capacitor 50 were erased, the associated diode 40 would be insufficient to cause reverse conduction. As for the unselect rows $R_j$, the associated capacitors 50 can be in one of two possible states. If the associated capacitor 50 is erased, then the first electrode 44 would also be at −4.8 volts, which is insufficient to cause reverse conduction. If the associated capacitor 50 is programmed, then the first electrode 44 would be at +0.2 volts, which is only +0.4 volts differential from the unselect column line $C_i$. This also would not be sufficient to cause the associated diode 40 to forward conduct.

In the erase operation, with the select column $C_j$ at 0.0 volts, and the select row $R_i$ at 0.5 volts, the associated diode 40 would conduct and the voltage on the first electrode 44 would decrease until there is 0.5 volts on the first electrode or zero voltage differential with the select row $R_i$. With the unselected rows $R_j$ at −4.5 volts, this is insufficient to cause reverse conduction even if the associated capacitor 50 were erased, and is insufficient to cause forward conduction if the associated capacitor 50 were programmed.

In the erase operation, with the unselect column $C_i$ at +5.0 volts and the select row $R_i$ at 0.5 volts, even if the associated capacitor 50 were programmed, the associated diode 40 would not forward conduct. As for the unselected rows $R_j$, they are maintained at −4.5 volts. Thus even if the associated capacitor 50 were erased, the associated diode 40 would not conduct.

Reading

The read operation for the memory unit 130 is similar to the read operation for the memory unit 30. The column line $C_j$ of the memory section 12a or 12b, containing the select memory capacitor 50, and the corresponding column line $C_j$ of the memory section 12b or 12a not containing the selected memory capacitor 50 are precharged to +2 volts.

During the phase of pre-charging the selected column line $C_j$, all of the row lines, including the selected row line $R_i$ is maintained at −2.8 volts. At this voltage, even if the selected memory capacitor 50 is charged to a state of "1", the diode 40 would not forward conduct. When the read operation commences, the first clock signal φ1 causes the select row line $R_i$ to be raised to zero volts or ground. If the select memory capacitor 50 is programmed, the diode 40 will forward conduct causing charges on the capacitor 50 to be added to the pre-charged column line $C_j$. The diode 40 will conduct until the voltage on the first electrode 44 reaches approximately +2.5 volts. If the select memory capacitor 50 has zero voltage stored or is in a state of "0", the diode 40 will not conduct, leaving the pre-charged column line $C_j$ undisturbed. The unselected row lines $R_a \ldots R_{i-1}, R_{i+1} \ldots R_n$ remain at −2.8 volts.

Thereafter, during clock cycle φ2, the select row line $R_i$ selecting the select memory capacitor 50 is lowered to −5.0 volts. If the select memory capacitor 50 is programmed, the action of the diode 40 conducting during the first clock cycle would leave approximately +2.5 volts on the first electrode 44, when the second electrode 46 is at ground. Lowering the voltage on the second electrode 46 causes the voltage on the first electrode 44 to drop to approximately −2.5 volts. This is only a differential of −4.5 volts on the diode 40 and thus is not able to cause the diode 40 to reverse conduct. If the select memory capacitor 50 is erased, during the first clock cycle φ1, the capacitor 50 would be undisturbed. During the second clock signal φ2, lowering the voltage on the second electrode 46 causes the voltage on the first electrode 44 to drop to approximately −5.0 volts. This causes a differential of approximately −7.0 volts on the diode 40 and is sufficient to cause the diode 40 to reverse conduct. This then drains the pre-charged column line $C_j$ of a certain amount of charge. The difference between the pre-charged column line $C_j$ of the selected memory section 12a and the corresponding pre-charged column line $C_j$ of the unselected memory section 12b can be differentially sensed.

Similar to the discussion for the memory unit 30 regarding minimization of power consumption, the following voltages can be applied during the read operation.

|      | $C_j$ | $C_i$ | $R_i$ | $R_j$ |
|------|-------|-------|-------|-------|
| Read | 4.8   | f     | φ1 2.5<br>φ2 −2.5 | 0 |

Second Embodiment of a Memory Array Circuit

Figure 10:
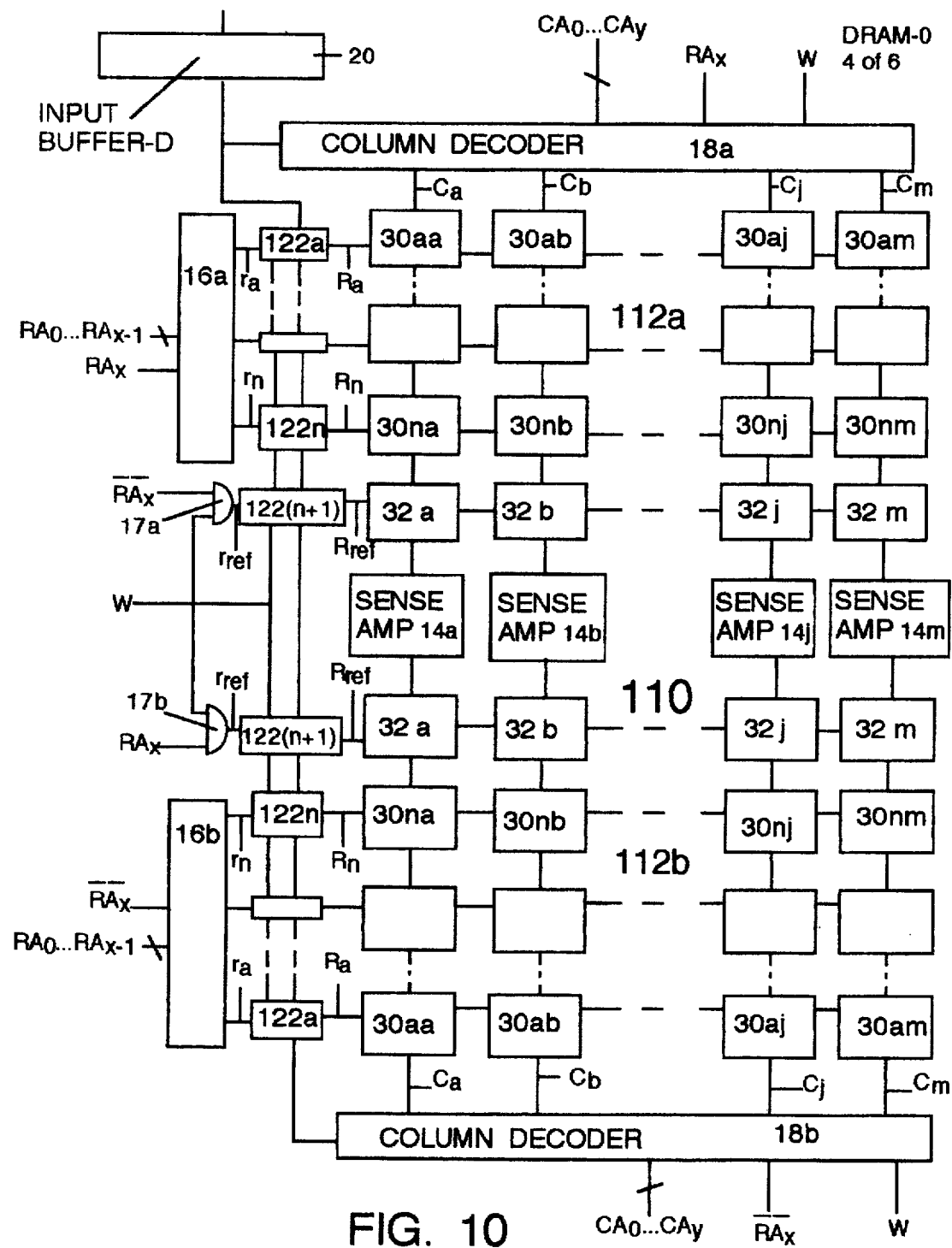
FIG. 10 is a schematic block level diagram of a second embodiment of a memory array circuit of the present invention, suitable for use with DRAM memory units, comprising DRAM cells.

Referring to FIG. 10 there is shown a block diagram of a second embodiment of a semiconductor memory array circuit 110 of the present invention. The array circuit 110 is very similar to the array circuit 10 shown in FIG. 1 and as described above. Therefore, like numerals will be used for same or similar parts.

The basic difference between the array circuit 110 and the array circuit 10 is that for the array circuit 10, the read operation requires two clock cycles before the select sense amplifier 14 can be activated. As will be seen, in the read operation of the array circuit 110, the sense amplifier 14 can be activated much sooner. However, this increase in speed of read operation is achieved at a cost of using reference memory units 32a . . . 32m in each of the memory sections 112a and 112b.

Similar to the array circuit 10, the array circuit 110 comprises two sections of memory units: first memory section 112a and second memory section 112b. The first memory section 112a comprises a plurality of data memory units 30aa . . . 30nm arranged in a plurality of n rows and a plurality of m columns, connected by a plurality of n row lines $R_a \ldots R_n$ and a plurality of m column lines $C_a \ldots C_m$. The first memory section 112a also comprises a plurality of reference memory units 32a . . . 32m, connected in a single row $R_{ref}$ with one reference memory unit 32, e.g. 32j, connected to a different column line $C_j$ of the first memory section 112a.

The second memory section 112b also comprises a plurality of data memory units 30aa . . . 30nm also arranged in a plurality of n rows and a plurality of m columns, connected by a plurality of n row lines $R_a \ldots R_n$, and a plurality of m column lines $C_a \ldots C_m$. The second memory section 112b also comprises a plurality of reference memory units 32a . . . 32m, connected in a single row $R_{ref}$ with one reference memory unit 32, e.g. 32j, connected to a different column line $C_j$ of the second memory section 112b.

Each of the memory units 30 and each of the reference units 32 comprises a DRAM memory capacitor 50 (shown in FIGS. 2, 8 or 14). The reference memory units 32 and the data memory units 30 are identical except for the size of the capacitor 50 for storing the amount of charges. The capacitor 50 of a reference memory unit 32 has approximately one-half the capacitance of the capacitor 50 of a memory unit 30.

A sense amplifier 14 is connected to a column line, e.g. $C_j$, of the first memory section 112a and to a corresponding column line, e.g. $C_j$, of the second memory section 112b. Each sense amplifier 14, e.g. $14_j$, differentially senses the charges on a column line, e.g. $C_j$, of the first memory section 112a, caused by a data memory cell 50, e.g. any of the memory units $30aj \ldots 30nj$, of the first memory section 112a being connected thereto, with the charges on a corresponding column line $C_j$, of the second memory section 112b, caused by a reference memory unit $32j$ of the second memory section 112b being connected thereto. The output of each sense amplifier 14 is supplied to an output buffer (not shown).

Within the first memory section 112a, the circuit 110 comprises a first row decoder 16a for receiving and decoding a row address signal $RA_0 \ldots RA_{(x-1)}$. The first row decoder 16a also receives the row address signal $RA_x$. The first row decoder 16a decodes the row address signal $RA_0 \ldots RA_{(x-1)}$, if the row address signal $RA_x$ is high. The output of the first row decoder 16a is a plurality of row output signals, $r_a \ldots r_n$. Each of the row output signals $r_a \ldots r_n$ of the first row decoder 16a is supplied to a control circuit 122a $\ldots$ 122n and has a corresponding row line $R_a \ldots R_n$. The row address signal $\overline{RA_x}$ and the read/write signal W are supplied to an AND gate 17a, to generate the row output signal $r_{ref}$. The row output signal $r_{ref}$ is similar to the row output signals $r_a \ldots r_n$ in that it is supplied to a control circuit 122(n+1), which can be identical to the other control circuits 122, and has a corresponding row line $R_{ref}$ which is connected to all the reference memory units 32. Each of the control circuits 122 receives one of the row output signals $r_a \ldots r_n$, $r_{ref}$ and the read/write signal W and the state of the input signal D, and in response thereto, supplies an appropriate control signal to its corresponding row line $R_a \ldots R_n$, $R_{ref}$. However, since the reference cells 32 are used only during the read operation, the control circuit 122(n+1) associated therewith need to comprise only the read circuit 126 portion (see FIG. 11).

Within the second memory section 112b, the circuit 110 comprises a second row decoder 16b for receiving and decoding a row address signal $RA_0 \ldots RA_{(x-1)}$, which is the same row address signal supplied to the first row decoder 16a. The second row decoder 16b also receives the row address signal $\overline{RA_x}$. The second row decoder 16b decodes the row address signal $RA_0 \ldots RA_{(x-1)}$, if the row address signal $\overline{RA_x}$ is high. Thus, although the same row address signal $RA_0 \ldots RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b has a plurality of row output signals, $r_a \ldots r_n$. Each of the row output signals $r_a \ldots r_n$ of the second row decoder 16b is supplied to a control circuit 122a $\ldots$ 122n and has a corresponding row line $R_a \ldots R_n$. The row address signal $RA_x$ and the read/write signal W are supplied to an AND gate 17b to generate the row output signal $r_{ref}$. The row output signal $r_{ref}$ is similar to the row output signals $r_a \ldots r_n$ in that it is supplied to a control circuit 122(n+1), which can be identical to the other control circuits 122, and has a corresponding row line $R_{ref}$ which is connected to all the reference memory units 32. Each of the control circuits 122 receives one of the row output signals $r_a \ldots r_n$, $r_{ref}$ and the read/write signal W and the state of the input signal D, and in response thereto supplies an appropriate control signal to its corresponding row line $R_a \ldots R_n$, $R_{ref}$.

Within the first memory section 112a, the circuit 110 comprises a first column decoder 18a. Except for the precharge circuit 84 being connected to a source of +5 volts, the first column decoder 18a is shown in FIG. 7. Within the second memory section 112b, the circuit 110 comprises a second column decoder 18b. The second column decoder 18b receives the same column address signal $CA_0 \ldots CA_y$, as received by the first column decoder 18a, and the row address signal $\overline{RA_x}$ and the same read/write signal W. In response, the second column decoder 18b selects one of the column lines $C_a \ldots C_m$ of the second memory section 112b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column address signal $CA_0 \ldots CA_y$, the same column line $C_j$ will be chosen, causing the sense amp $14j$ to sense differentially the charges on the column line $C_j$ of the first memory section 112a from the corresponding column line $C_j$ of the second memory section 112b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 112a. If $\overline{RA_x}$ is high, then only second column decoder 18b and only second row decoder 16b will be active, thereby activating only the column and row lines of the second memory section 112b.

The array circuit 110 also comprises a conventional input buffer 20 for receiving a data signal D that is to be stored in one of the plurality of memory units $30aa \ldots 30nj$ of either the first memory section 112a or the second memory section 112b. The input signal D is supplied to each of the control circuits 122.

Figure 11:
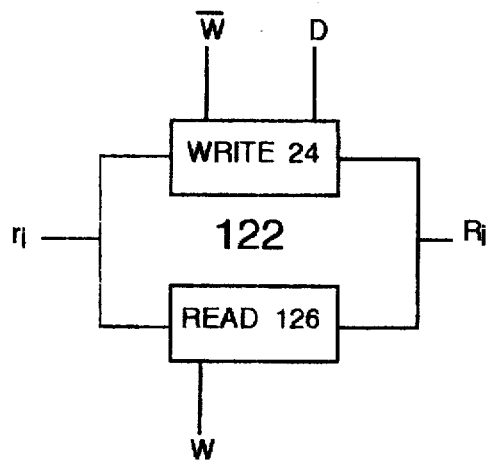
FIG. 11 is a block level diagram of a second embodiment of a control circuit suitable for use in the second embodiment of the memory array circuit shown in FIG. 10.

The control circuit 122 for the array 110 is shown in greater detail in FIG. 11. The circuit 122 comprises a write circuit 24, shown in FIG. 4, and a read circuit 126. The read circuit 126 is shown in greater detail in FIG. 12. The read circuit 126 comprises an AND gate 150 which receives as its inputs the read/write signal W and the row output signal $r_i$. The output of the AND gate 150 is supplied to the gate of a N type MOS transistor 152. The source of the MOS transistor 152 is connected to ground. The drain of the transistor 152 is connected to row line $R_i$.

The output of the AND gate 150 is inverted by an invertor 154, whose output is supplied to AND gate 156. The read/write signal W is also supplied as an input to the AND gate 156. The output of the AND gate 156 is inverted by invertor 158, whose output is then supplied to the gate of a P type MOS transistor 160. The source of the P type MOS transistor is connected to +5 volts. The drain of the transistor 160 is connected to the row line $R_i$.

When the read/write signal W is high, indicating a read operation, and the unselected row output signal, e.g. $r_a$ is low, this turns on transistor 160, connecting the row line $R_i$ to +5 volts. This condition also turns off transistor 152. When the read/write signal W is high and the selected row output signal $r_i$ is high, this turns on transistor 152, connecting the row line $R_i$ to ground. This condition also turns off transistor 160. Thus, during a read operation, the selected row line $R_i$ is connected to ground.

First Embodiment of A Memory Unit

The memory unit 30, shown in FIG. 2, can be used with the circuit 110. However, as previously discussed, for read or write operations, depending upon the voltages on the selected column line $C_j$, the control circuit 122 shown in FIG. 11 is only one of many possible embodiments. Again, for purpose of this discussion, the avalanche diode 40 is assumed to have a forward bias threshold voltage of +0.5v and a reverse breakdown voltage of −5.0 volts. For the purpose of describing the embodiment of the array circuit 110, the following voltages are assumed.

|  | $C_j$ | $C_i$ | $R_i$ | $R_j$ |
|---|---|---|---|---|
| Program | 5 | f | 0 | 5 |
| Erase | 0 | f | 5 | 0 |
| Read | 5 | f | 0 | 5 |

The voltages shown above also assumes that the unselected column lines $C_a \ldots C_{(j-1)}C_{(j+1)} \ldots C_m$ are sufficiently insulated from the selected column line $C_j$ so that the unselected column lines $C_a \ldots C_{(j-1)}C_{(j+1)} \ldots C_m$ may be maintained at a floating state. As for the unselected row lines $R_a \ldots R_{(i-1)}R_{(i+1)} \ldots R_n$, e.g. $R_j$, a voltage is applied thereto (and not maintained at floating) because typically row lines are made as diffusion lines on a substrate 80, presenting potential write disturbance conditions. However, if the row lines are fabricated sufficiently insulated from one another, e.g. by Silicon On Sapphire technology, then the unselected row lines $R_a \ldots R_{(i-1)}R_{(i+1)} \ldots R_n$ can be maintained at floating.

Writing

The writing of the memory array circuit 110 with the memory unit 30 to a state of "1" or "0" is identical to the operation described heretofore for the embodiment shown in FIG. 1.

Write Disturbance

The discussion of the write disturbance of the select memory unit 30 for the array circuit 110 is identical to the discussion of the write disturbance of the select memory unit 30 for the array circuit 10, shown in FIG. 1. In addition, the alternative voltages for writing discussed for the array circuit 10 using memory units 30 to minimize power consumption is also applicable to the array circuit 110 using memory units 30.

Reading

To read the memory cell 50 of a select memory unit 30, assume that the memory cell 50$ij$ is from the first memory section 112$a$. In that event row address signal $RA_x$ is high. In addition, for a read operation the read/write signal W is also high. The same select column line, e.g. $C_j$, of both memory sections 112$a$ and 112$b$ are first pre-charged to a voltage source of +5 volts. This can be done for example by applying a voltage source to the selected column line $C_j$ of the first memory section 112$a$ and the selected column line $C_j$ of the second memory section 112$b$, and equilibrating the two, i.e. connecting them together momentarily, then disconnecting the voltage source, and maintaining the column lines $C_j$ of both memory sections 112$a$ and 112$b$ at floating.

During the precharging of the select column lines $C_j$ of the first and second memory sections 112$a$ and 112$b$, all of the row lines, including the select row line $R_i$, and the reference row line $R_{ref}$ of the selected memory section 112$a$ are held at +5 volts. In addition, all of the row lines of the second memory section 112$b$, including the reference row line $R_{ref}$ of the unselected memory section 112$b$ are held at +5 volts. In this manner, none of the diodes 40 associated with any of the memory unit 30 or the reference unit 32 is conducting.

The select row line $R_i$ of the selected memory section 112$a$, selecting the select memory unit 30$ij$, and the reference row line $R_{ref}$ of the unselected memory section 112$b$ are simultaneously lowered to +0 volts. The reference memory cell unit is set to "0" and has one-half the capacitance of the select memory capacitor 50.

The selected row line $R_i$ of the first memory section 112$a$ and the reference row line $R_{ref}$ of the second memory section 112$b$ cause changes to the charges on the select column lines $C_j$ of the first and second memory sections 112$a$ and 112$b$, which are differentially sensed. The result determines the state of charges in the select memory capacitor 50.

If the select memory cell 50 in first memory section 112$a$ is set to "0", i.e. with zero volts on the first electrode 44, the grounding of the select row line $R_i$ would cause the diode 40 to be in a forward conduction mode. Similarly, the reference memory unit 32 in the unselect memory section 112$b$ would also have its associated diode 40 in a forward conduction mode. However, since the capacitor 50 of the memory unit 30 has a larger capacitance than the capacitor 50 of the reference unit 32, the amount of charge drained from the column line $C_j$ of the first memory section 112$a$ would be greater than the amount of charge drained from the column line $C_j$ of the second memory section 112$b$.

If the select memory capacitor 50 is programmed, i.e. with +4.5 volts on the first electrode 44, the grounding of the voltage on the row line $R_i$ of the first memory section 112$a$ would cause the diode 40 to conduct little if any charges from the column line $C_j$ of the select memory section 112$a$. However, the reference memory unit 32 would have its associated diode 40 in a forward conduction mode. Thus, the column line $C_j$ of the unselected or second memory section 112$b$ would cause more charges to be drained than the column line $C_j$ of the first memory section 112$a$. Again the differential sensing of the charges on the column lines $C_j$ of the first memory section 112$a$ and the second memory section 112$b$ determines the state of the charges of the selected memory capacitor 50.

Similar to the discussion regarding alternative voltages that can be used during the read operation for the array circuit 10 using memory units 30 to minimize power consumption, the following voltages can also be used for the array circuit 110 using memory units 30 during the read operation.

|  | $C_j$ | $C_i$ | $R_i$ | $R_j$ |
|---|---|---|---|---|
| Read | 0 | f | −5 | 0 |

Second Embodiment of A Memory Unit

Similar to the discussion for the embodiment of the array circuit 10 using the alternative memory unit 130, the memory unit 130 can also be used in the memory array 110. The analysis for writing and write disturbance is the same as that for the embodiment of the array circuit 10 using the memory unit 130, discussed previously. The only difference is during the read operation. The voltages for the operation of the array circuit 110 with the memory unit 130 can be as follows:

|  | $C_j$ | $C_i$ | $R_i$ | $R_j$ |
|---|---|---|---|---|
| Program | 0 | f | −10.0 | −4.8 |
| Erase | 0 | f | +.5 | −4.8 |
| Read | 5 | f | −2.0 | +.2 |

The alternative voltages that can be used during the write operation for the array circuit 10 using memory units 130 to minimize power consumption, discussed previously, can also be used. In addition, by changing the write voltage, and the forward and reverse conduction voltages of the diode 40, the memory unit 130 can be operated with a voltage applied to the unselect columns $C_i$ to minimize write disturbance, all as discussed previously.

Reading

The read operation for the memory unit 130 is similar to the read operation for the memory unit 30. The column lines $C_j$ of the memory section 112a or 112b, containing the select memory cell 50, and the corresponding column line $C_j$ of the memory section 112b or 112a not containing the select memory cell 50 are precharged to +5 volts. All of the row lines, including the select row line $R_i$ of the select memory section 112a, and all of the row lines, including the reference row line $R_{ref}$ of the unselected memory section 112b, are maintained at +0.2 volts, during the pre-charging operation. This prevents charges stored on any of the capacitors 50, including the reference capacitors of the reference unit 32 from affecting the precharged column lines $C_j$. The select row line $R_i$ of the select memory section 112a and the reference row line $R_{ref}$ of the unselect memory section 112b are then lowered simultaneously to -2.0 volts. The reference memory unit 32 will reverse conduct, since it was in a state of "0". Thus, charges will be drained from the column line $C_j$ of the non-selected memory section 112b. If the select memory cell 50 is also set to "0", then more charges are drained from the select column line $C_j$ of the select memory section, due to the larger capacitance of the select memory capacitor 50. If the select memory capacitor 50 is programmed, then little or no charge would be drained from the column line $C_j$ of the selected memory section 112a. The charges on the two select column lines $C_j$ of the two memory sections 112a and 112b are sensed differentially.

An alternative voltage that can be used during the read operation to minimize power consumption can be as follows.

|      | $C_j$ | $C_i$ | $R_i$ | $R_j$ |
|------|-------|-------|-------|-------|
| Read | 4.8   | f     | -2.2  | 0     |

Third Embodiment of a Memory Array Circuit

Figure 13:
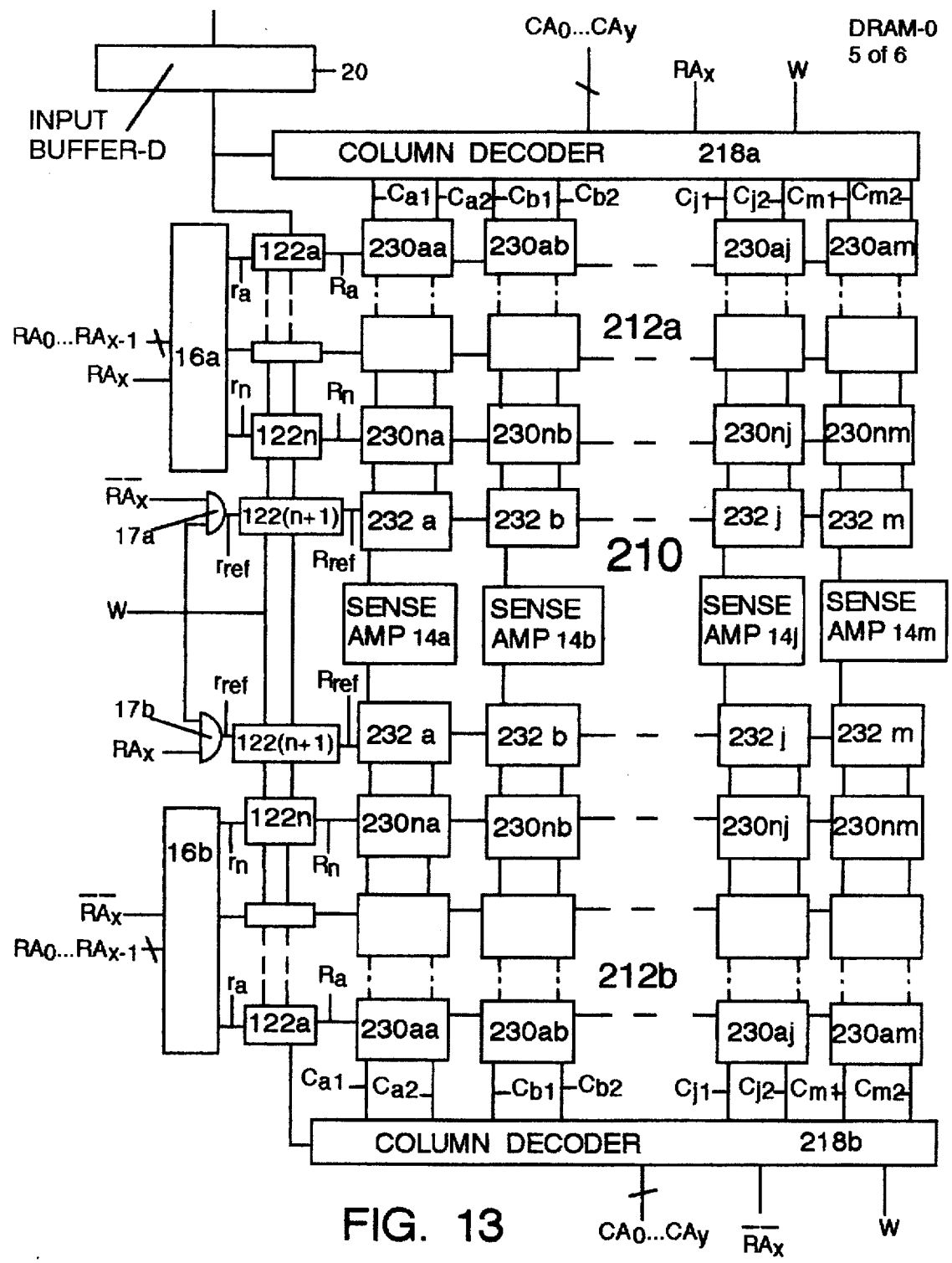
FIG. 13 is a schematic block level diagram of a third embodiment of a memory array circuit of the present invention, suitable for use with DRAM memory units comprising DRAM cells.

Referring to FIG. 13 there is shown a block diagram of a third embodiment of a semiconductor memory array circuit 210 of the present invention. The array circuit 210 is very similar to the array circuit 110 shown in FIG. 10 and as described above. Therefore, like numerals will be used for same or similar parts.

The basic difference between the array circuit 210 and the array circuit 110 is that each of the memory units 230 in the array 210 uses two P-N junction diodes 240 rather than a single avalanche diode 40. The array circuit 10 or 110 is the preferred embodiment of the present invention. However, if the manufacturability of the memory units 30 or 130, requiring avalanche diodes 40 having precise forward conduction threshold, and reverse conduction threshold for millions of memory units 30 or 130 in an array circuit 10 or 110, is difficult to achieve, then array circuit 210 is preferred. As a result of using two P-N junction diodes 240, the array circuit 210 has two column lines for each memory unit 230 aligned in the same column.

Similar to the array circuit 10 or 110, the array circuit 210 comprises two sections of memory units: first memory section 212a and second memory section 212b. The first memory section 212a comprises a plurality of data memory units 230aa ... 230nm arranged in a plurality of n rows and a plurality of m columns, connected by a plurality of n row lines $R_a$ ... $R_n$ and a plurality of pairs of m column lines $C_{a1}C_{a2}$ ... $C_{m1}C_{m2}$. The first memory section 212a also comprises a plurality of reference memory units 232a ... 232m, connected by a reference row line $R_{ref}$ with one reference memory unit 232, e.g. 232j, connected to a different pair of column lines $C_{j1}C_{j2}$ of the first memory section 212a.

The second memory section 212b also comprises a plurality of data memory units 230aa ... 230nm also arranged in a plurality of n rows and a plurality of m columns, connected by a plurality of n row lines $R_a$ ... $R_n$, and a plurality of pairs of m column lines $C_{a1}C_{a2}$ ... $C_{m1}C_{m2}$. The second memory section 212b also comprises a plurality of reference memory units 232a ... 232m, connected by a reference row line $R_{ref}$ with one reference memory unit 232, e.g. 232j, connected to a different pair of column lines $C_{j1}C_{j2}$ of the second memory section 212b.

Each of the memory units 230 and the reference units 232 comprises a DRAM memory cell 50 which is in the nature of a capacitor, shown in FIG. 14. The reference memory units 232 and the data memory units 230 are identical except for the size of the capacitor 50 for storing the amount of charges.

A sense amplifier 14 connects one of the pairs of column lines, e.g. $C_{j1}$, in each column of the first memory section 212a to a corresponding one of the pairs of column line, e.g. $C_{j1}$, in each column of the second memory section 212b. The sense amplifier 14, e.g. 14$_j$, differentially senses the charges on a column line, e.g. $C_{j1}$, of the first memory section 212a, caused by a data memory unit 230, e.g. any of the memory units 230aj ... 230nj, of the first memory section 212a being connected thereto, with the charges on a corresponding column line $C_{j1}$, of the second memory section 212b, caused by a reference memory unit, e.g. 232j of the second memory section 212b being connected thereto. The output of each sense amplifier 14 is supplied to an output buffer (not shown).

Within the first memory section 212a, the circuit 210 comprises a first row decoder 16a for receiving and decoding a row address signal $RA_0$ ... $RA_{(x-1)}$. The first row decoder 16a also receives the row address signal $RA_x$. The first row decoder 16a decodes the row address signal $RA_0$ ... $RA_{(x-1)}$, if the row address signal $RA_x$ is high. The output of the first row decoder 16a is a plurality of row output signals, $r_a$ ... $r_n$. Each of the row output signals $r_a$ ... $r_n$ of the first row decoder 16a is supplied to a control circuit 122a ... 122n (shown in FIG. 11 and described above) and has a corresponding row line $R_a$ ... $R_n$. The row address signal $\overline{RA_x}$ and the read/write signal W are supplied to an AND gate 17a, to generate the row output signal $r_{ref}$. The row output signal $r_{ref}$ is similar to the row output signals $r_a$ ... $r_n$ in that it is supplied to a control circuit 122(n+1), which can be identical to the other control circuits 122, and has a corresponding reference row line $R_{ref}$ which is connected to all the reference memory units 232. As will be discussed, each of the control circuits 122 receives a row output signal $r_a$ ... $r_n$, $r_{ref}$ and the read/write signal W and the state of the input signal D, and in response thereto, supplies an appropriate control signal to its corresponding row line $R_a$ ... $R_n$, $R_{ref}$. However, since the reference cells 232 are used only during the read operation, the control circuit 122(n+1) associated therewith need to comprise only the read circuit 126 portion (see FIG. 11).

Within the second memory section 212b, the circuit 210 comprises a second row decoder 16b for receiving and decoding a row address signal $RA_0 \ldots RA_{(x-1)}$, which is the same row address signal supplied to the first row decoder 16a. The second row decoder 16b also receives the row address signal $\overline{RA_x}$. The second row decoder 16b decodes the row address signal $RA_0 \ldots RA_{(x-1)}$, if the row address signal $\overline{RA_x}$ is high. Thus, although the same row address signal $RA_0 \ldots RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b has a plurality of row output signals, $r_a \ldots r_n$. Each of the row output signals $r_a \ldots r_n$ of the second row decoder 16b is connected to a control circuit 122a ... 122n and has a corresponding row line $R_a \ldots R_n$. The row address signal $RA_x$ and the read/write signal W are supplied to an AND gate 17b to generate the row output signal $r_{ref}$. The row output signal $r_{ref}$ is similar to the row output signals $r_a \ldots r_n$ in that it is supplied to a control circuit 122(n+1), which can be identical to the other control circuits 122, and has a corresponding row line $R_{ref}$ which is connected to all the reference memory units 232. Each of the control circuits 122 receives one of the row output signals $r_a \ldots r_n$, $r_{ref}$ and the read/write signal W and the state of the input signal D, and in response thereto supplies an appropriate control signal to its corresponding row line $R_a \ldots R_n$, $R_{ref}$.

Within the first memory section 212a, the circuit 210 comprises a first column decoder 218a. The first column decoder 218a receives the column address signal $CA_0 \ldots CA_y$, the row address signal $RA_x$, the read/write signal W, and the input signal D. In response, the first column decoder 218a selects one of the column lines from $C_{a1} \ldots C_{m1}$ or from $C_{a2} \ldots C_{m2}$, depending upon the input signal D, if the operation is write, and selects one of the column lines $C_{a1} \ldots C_{m1}$, if the operation is read.

Within the second memory section 212b, the circuit 210 comprises a second column decoder 218b. The second column decoder 218b receives the same column address signal $CA_0 \ldots CA_y$, as received by the first column decoder 218a, and the row address signal $\overline{RA_x}$, the same read/write signal W, and the same input signal D. In response, the second column decoder 218b also selects one of the column lines from $C_{a1} \ldots C_{m1}$ or from $C_{a2} \ldots C_{m2}$, depending upon the input signal D, if the operation is write, and selects one of the column lines $C_{a1} \ldots C_{m1}$, if the operation is read.

The first column decoder 218a is activated if the read/write signal W is high (indicating a read operation), or if the signal $RA_x$ is high. The second column decoder 218b is activated if the read/write signal W is high (indicating a read operation), or if the signal $\overline{RA_x}$ is high. Thus, in the event the read/write signal W is high, indicating a read operation, both column decoders 218a and 218b are activated. Since they both receive the same column address signal $CA_0 \ldots CA_y$, the same column line $C_{j1}$ will be chosen, causing the sense amp 14j to sense differentially the charges on the column line $C_{j1}$ of the first memory section 212a from the column line $C_{j1}$ of the second memory section 212b. In the event the read/write signal W is low, indicating a write operation, then only one of the column decoders 218a or 218b will be active. The choice of the column decoder 218a and 218b that will be active is determined by the signal $RA_x$ and $\overline{RA_x}$. If $RA_x$ is high, then only first column decoder 218a and first row decoder 16a will be active, thereby activating only the column and row lines of the first memory section 212a. If $\overline{RA_x}$ is high, then only second column decoder 218b and second row decoder 16b will be active, thereby activating only the column and row lines of the second memory section 212b.

The array 210 also comprises a conventional input buffer 20 for receiving a data signal D that is to be stored in one of the plurality of memory units 230aa ... 230nj of either the first memory section 212a or the second memory section 212b. The input signal D is supplied to each of the control circuits 122. Finally, the circuit 210 receives the read/write signal W, which is also supplied to each of the control circuits 122.

Referring to FIG. 14, there is shown a memory unit 230 suitable for use with the circuit 210. The memory unit 230 comprises a DRAM memory cell 50, which is a capacitor. The capacitor 50 has a first electrode 44 and a second electrode 46. The second electrode 46 is connected to the associated row line $R_i$.

A first PN-junction diode 240a has a first anode 140a and a first cathode 140b. The first anode 140a is connected to the associated first column line $C_{j1}$. The first cathode 140b is connected to the first electrode 44. A second PN-junction diode 240b has a second anode 142a and a second cathode 142b. The second cathode 142b is connected to the associated second column line $C_{j2}$. The second anode 142a is connected to the first electrode 44. The diodes 240a and 240b can be made out of polysilicon and can be placed above the silicon substrate 80. Alternatively, the diodes 240a and 240b can be fabricated in the semiconductor substrate 80 with the capacitor 50 thereby fabricated "above" the diodes 240.

Again, similar to the foregoing discussion, the principle of operation for programming and erasing of the memory unit 230 is that it depends upon the voltage differential between the selected first column line $C_{j1}$, and the selected row line $R_i$ to cause a forward conduction of the first diode 240a to program, and it depends upon the voltage differential between the selected second column line $C_{j2}$, and the selected row line $R_i$ to cause a forward conduction of the second diode 240b to erase. Thus, the control circuit 122 supplies a voltage to the select row line $R_i$ to cause a program or erase operation, depending upon the voltage that is applied to the selected first column line $C_{j1}$ or to the second column line $C_{j2}$ as the case may be.

Furthermore, the principle of operation for reading the state of the memory unit 230 also depends upon the voltage precharged on the selected first column line $C_{j1}$ and the selected row line $R_i$ to cause a forward conduction of the first diode 240a, depending upon the charges stored on the capacitor 50.

Therefore, for both read and write operation, an embodiment of the control circuit 122 shown in FIG. 11 is only one of many possible embodiments depending upon the voltage of the selected column line. Furthermore, for purpose of this discussion, each of the first and second diodes 240a and 240b is assumed to have a forward bias threshold voltage of +0.5v. For the purpose of describing the operation of the array circuit 210, the following voltages are assumed.

|  | $C_{j1}$ | $C_{j2}$ | $C_i$ | $R_i$ | $R_j$ |
|---|---|---|---|---|---|
| Program | 5 | f | f | 0 | 5 |
| Erase | f | 4.5 | f | 5 | 0 |
| Read | 5 | f | f | 0 | 5 | where program is to write a data signal of "high" or "1" into a select capacitor 50 defined at the intersection of column line $C_{j1}$ and row line $R_j$. Erase is to write a data signal of "low" or "0" into a select capacitor 50 defined at the intersection of column line $C_{j2}$ and row line $R_i$. Read is to read the state of the data signal stored in the select capacitor 50 defined at the intersection of column line $C_{j1}$ and row line $R_i$. $C_i$ is an unselected column line. f is floating. $R_j$ is an unselected row line.

The voltages shown above also assumes that the unselected column lines $C_{a1}C_{a2} \ldots C_{(j-1)2}C_{(j+1)1} \ldots C_{m2}$ are sufficiently insulated from the selected column line $C_{j1}$ or $C_{j2}$ so that the unselected column lines may be maintained at a floating state. As for the unselected row line $R_j$, a voltage is applied thereto (and not maintained at floating) because typically row lines are made as diffusion lines on a substrate 80, presenting potential write disturbance conditions. However, if the row lines are fabricated sufficiently insulated from one another, e.g. by Silicon On Sapphire technology, then the unselected row lines $R_a \ldots R_{(i-1)}R_{(i+1)}$ $\ldots R_n$ can be maintained at floating.

Figure 12:
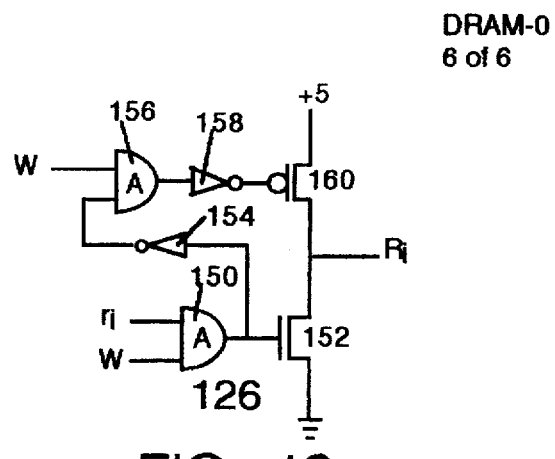
FIG. 12 is a circuit diagram of a read circuit suitable for use in the second embodiment of the control circuit shown in FIG. 11.

The control circuit 122 for the array 210 is shown in greater detail in FIGS. 4, 11, and 12, and has been described heretofore.

Figure 15:
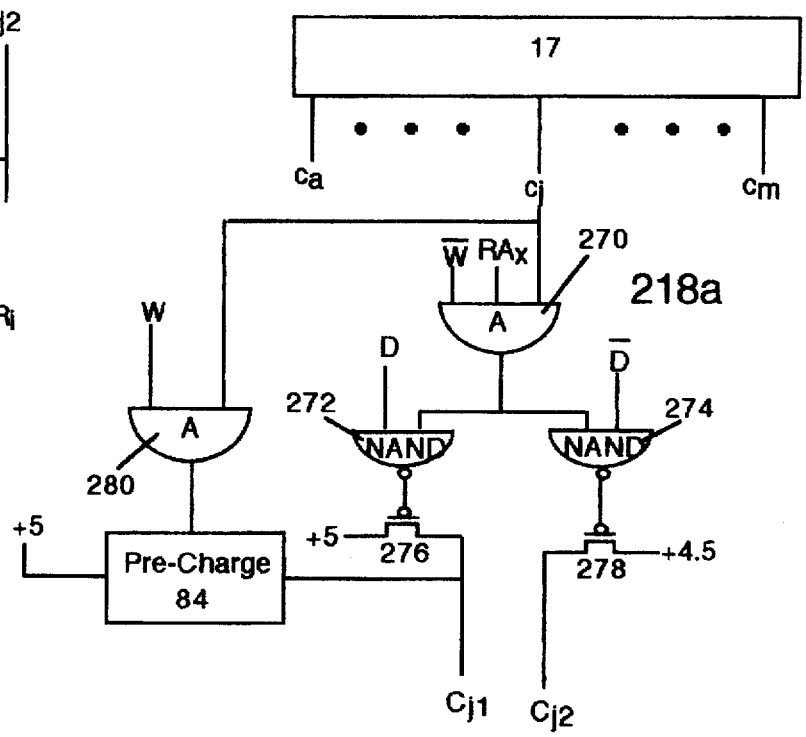
FIG. 15 is a circuit diagram of a portion of a column decoder suitable for use in the third embodiment of the memory array circuit shown in FIG. 13.

A portion of the column decoder 218a, which can supply the necessary voltages described above, is shown in greater detail in FIG. 15. The column decoder 218a comprises a conventional decoder 17, having column output signals $c_a$ . . . $c_m$. Each column output signal, e.g. $c_j$ is supplied to one input of an AND gate 270. The read/write signal $\overline{W}$ and the row address signal $RA_x$ are also supplied to the other inputs of AND gate 270. The output of the AND gate 270 is supplied as input to two NAND gates 272 and 274, respectively, each of which also has as its inputs the data signal D and the data signal $\overline{D}$ supplied as input thereto. The output of the NAND gate 272 is supplied to the gate of a PMOS transistor 276, having one end connected to +5 volts, and the other end connected to column line $C_{j1}$. A second PMOS transistor 278 has one end connected to +4.5 volts, and another end connected to $C_{j2}$.

An AND gate 280 receives as its input the read/write signal W and the column output signa $c_j$. The output of the AND gate 280 is supplied to the pre-charge circuit 84, with one end connected to a +5 volt source, and the other end connected to column line $C_{j1}$.

Writing

The writing of the memory array circuit 210 with the DRAM cell 50 to a state of "1" or the storage of charges on the capacitor 50 is as follows. The DRAM capacitor 50 is assumed to have either a charge of +4.5 volts (representing a state of "1") or a charge of 0.0 volts (representing a state of "0").

If a state of "1" is to be written into the DRAM cell 50, then the conventional column decoder 17 will select column output signal $c_j$ and raise it to high. For a write operation the read/write signal $\overline{W}$ will be high. However, if the appropriate memory section 212a or 212b is selected then either $RA_x$ or $\overline{RA_x}$ will be on. This will all be AND gated by gate 270. For a program operation, data signal D will be high. This results in a low signal supplied to the gate of PMOS transistor 276, to connect first column line $C_{j1}$ to +5 volts. Transistor 278 is turned off keeping the second column line $C_{j2}$ floating. All of the other unselected column output signals, e.g. $c_a$, will be low, resulting in the output of AND gate 270 being low. This is not sufficient to turn on transistors 276 or 278, thereby keeping the corresponding unselected column lines, e.g. $C_{a1}$ and $C_{a2}$ floating.

The operation of the write circuit 24 of the control circuit 122 has been discussed heretofore. For programming, the select row line $R_i$ is maintained at 0 volts, causing the diode 240a to forward conduct, charging the capacitor 50 to +4.5 volts.

If a state of "0" is to be written into the DRAM cell 50, then the column decoder 17 will selected column output signal $c_j$. For an erase operation $\overline{W}$ is high, data signal $\overline{D}$ is high, and $RA_x$ is high, then the output of the gates 270 and 274 are high and low respectively, turning on transistor 278, causing second column line $C_{j2}$ to be connected to +4.5 volts. For erasing, the select row line $R_i$ is maintained at 5 volts, causing the diode 240b to forward conduct if charges were stored on the capacitor 50, discharging it to +5.0 volts. Thereafter, when voltage is removed from the select row line $R_i$ the capacitor 50 would have zero volts.

Write Disturbance

In the write "1" operation, where +5 volts is applied to the selected first column line $C_{j1}$, write disturbance on the memory cells 50 in the same row is minimized by keeping the unselected first column lines $C_{a1} \ldots C_{(j-1)1}C_{(j+1)1} \ldots C_{m1}$, and all of the second column lines $C_{a2} \ldots C_{m2}$ at floating, and sufficiently insulated from the selected first column line $C_{j1}$. For the memory cells 50 in the same column, write disturbance is minimized by keeping the unselected row lines $R_a \ldots R_{(i-1)}R_{(i+1)} \ldots R_n$ at +5 volts, resulting in no voltage differential between the selected first column line $C_{j1}$ and the unselected row lines $R_a \ldots R_{(i-1)}R_{(i+1)} \ldots R_n$.

In the write "0" operation, where +4.5 volts is applied to the selected second column line $C_{j2}$, the second diode 240b prevents any voltage on the first electrode 44 of the memory cells in the same column but at different rows, from being passed through the second diode 240b, so long as the unselected row lines $R_a \ldots R_{(i-1)}R_{(i+1)} \ldots R_n$ are maintained at ground or zero volts.

A voltage can also be supplied to the unselect columns in accordance with the following to minimize write disturbance.

|  | $C_{j1}$ | $C_{j2}$ | $C_i$ | $C_{i2}$ | $R_i$ | $R_j$ |
|---|---|---|---|---|---|---|
| Program | 5 | 9.5 | 0 | 9.5 | 0 | 5 |
| Erase | 0 | 4.5 | 0 | 9.5 | 5 | 0 |

Reading

To read a select memory cell 50, assume that the memory unit 230 is from the first memory section 212a. In that event row address signal $RA_x$ is high. In addition, for a read operation the read/write signal W is also high. The same select column line, e.g. $C_j$, of both memory sections 212a and 212b are first pre-charged. This can be done for example by applying a voltage source to the selected first column line $C_{j1}$ of the first memory section 212a and the corresponding selected first column line $C_{j1}$ of the second memory section 212b, and equilibrating the two, i.e. connecting them together momentarily, then disconnecting the voltage source. During the pre-charging operation, all of the row lines, including the select row line $R_i$ of the select memory section 212a, and all of the row lines including the reference row line $R_{ref}$ of the unselect memory section 12b are held at +5 volts. In this condition, none of the diodes 240a is conducting.

The select row line $R_i$ of the select memory section 212a and the reference row line $R_{ref}$ of the unselect memory section 12b are lowered simultaneously to +0 volts. The charges on the select first column lines $C_{j1}$ of the first and second memory sections 212a and 212b are differentially sensed. The result determines the state of charges in the select memory cell 50.

If the select memory cell 50 in first memory section 212a is set to "0", i.e. with zero volts on the first electrode 44, the lowering of the voltage on the select row line $R_i$ would cause the first diode 240a to be in a forward conduction mode. Similarly, the reference memory unit 232 would also have its associated first diode 240a in a forward conduction mode. However, since the memory cell 50 of the select memory unit 230 has a larger capacitance than the capacitor 50 of the reference memory unit 232j, the amount of charge drained from the first column line $C_{j1}$ of the first memory section 212a would be greater than the amount of charge drained from the column line $C_{j1}$ of the second memory section 212b.

If the select memory cell 50 is written to "1", i.e. with +4.5 volts on the first electrode 44, the lowering of the voltage on the row line $R_i$ of the first memory section 212a would cause the first diode 240a to conduct little if any charges from the first column line $C_{j1}$ of the first memory section 212a. However, the reference memory unit 232j would have its associated first diode 240a in a forward conduction mode. Thus, the first column line $C_{j1}$ of the second memory section 212b would cause more charges to be drained than the first column line $C_{j1}$ of the first memory section 212a. Again the differential sensing of the charges on the first column lines $C_{j1}$ of the first memory section 212a and the second memory section 212b can determine the state of the charges of the selected memory cell 50.

Finally, similar to the previous discussion regarding alternative voltages that can be applied to minimize power consumption, the following voltages can also be used.

|         | $C_{j1}$ | $C_{j2}$ | $C_i$ | $R_i$ | $R_j$ |
|---------|------|------|-----|----|----|
| Program | 0    | f    | f   | -5 | 0  |
| Erase   | f    | 4.5  | f   | +5 | 0  |
| Read    | 0    | f    | f   | -5 | 0  |

From the foregoing it can be seen that various embodiments of a memory array circuit using diodes to transfer charges to a capacitor results in greater compactness of the memory array circuit. Transistors with their planar requirement are not used. In addition, it should be noted that the term column lines and row lines can be interchanged.

Although the invention has been described as being used with DRAM as the memory cell 50, it should be clear that the invention can also be used with a latch as the memory cell 50 or a non-volatile storage cell 50. Reference is made to U.S. patent applications, entitled "SRAM MEMORY CIRCUIT AND METHOD OF OPERATION THEREFOR" and "NON-VOLATILE MEMORY CIRCUIT AND METHOD OF OPERATION" filed even date herewith, whose disclosures are incorporated herein in their entirety by reference, which describes the use of the invention with a latch as the memory cell 50 or a non-volatile storage cell 50, respectively.

What is claimed is:

1. A memory circuit comprising:
   a plurality of first lines;
   a plurality of second lines;
   said plurality of first lines and plurality of second lines defining a matrix;
   a plurality of storage cells arranged in said matrix, with each storage cell having a data node and a voltage node; each of said plurality of storage cells having an associated first line and an associated second line, with said voltage node connected to said associated second line;
   a plurality of avalanche diode means, each avalanche diode means connecting the data node of a storage cell to its associated first line;
   first decoder means for decoding a first address signal and for selecting one of said plurality of first lines, in response thereto;
   second decoder means for decoding a second address signal and for generating one of a plurality of output signals in response thereto, each of said plurality of output signals having a corresponding second line; and
   a plurality of voltage control means each for receiving one of said plurality of output signals, and for applying a control signal to said corresponding second line, in response to a data read signal, a data write to one state signal or a data write to another state signal.

2. The memory circuit of claim 1 wherein said plurality of first lines are column lines; said plurality of second lines are row lines; said memory circuit is a DRAM circuit, wherein each of said plurality of storage capacitors is a volatile capacitor, having a first electrical connection and a second electrical connection; wherein said data node is said first electrical connection and said voltage node is said second electrical connection; wherein said plurality of capacitors are defined in a plurality of rows and columns with the capacitors in the same column having the same associated column line, with the capacitors in the same row having the same associated row line; and wherein each of said avalanche diode means has a first terminal and a second terminal, said first terminal connecting to said data node and said second terminal connecting to said associated column line.

3. The DRAM circuit of claim 2 wherein one of said plurality of capacitors in each column is a reference capacitor.

4. The DRAM circuit of claim 3 further comprising:
   means for precharging one of said column lines to a first voltage, and another of said column lines to said first voltage; and
   means for differentially sensing the charges on said one column address line with the charges on said another column address line;
   wherein said row decoder means and said column decoder means selects a capacitor connected to said one column address line, and selects a reference capacitor connected to said another column address line.

5. A DRAM memory device comprising:
   a plurality of first address lines;
   a plurality of second address lines;
   a plurality of capacitors arranged in a matrix in a plurality of substantially parallel first lines and a plurality of substantially parallel second lines, with the plurality of first lines substantially perpendicular to the plurality of second lines, each of said plurality of capacitors having a first electrical connection and a second electrical connection; wherein each of the capacitors arranged in the same first line has the same associated first address line, and wherein each of the capacitors arranged in the same second line, has the same associated second address line, with the second electrical connection of each of the capacitors connected thereto;
   a plurality of first diodes, each first diode having a first terminal and a second terminal, with said first terminal connected to the first electrical connection of one of said plurality of capacitors, and said second terminal connected to an associated first address line;
   first address decoder connected to said plurality of first address lines for receiving a first address signal and for selecting one of said first address lines, in response thereto;

second address decoder for receiving a second address signal and for generating one of a plurality of output signals in response, thereto, each of said plurality of output signals having a corresponding second address line;

wherein the selection of one of said first address lines and one of said second address lines defines a select capacitor; and a plurality of voltage control circuits, each for receiving one of said plurality of output signals, and for applying a control signal to a corresponding second address line, in response to a data read signal, a data write to one state signal or a data write to another state signal.

6. The DRAM memory device of claim 5 wherein each of said first diodes is a polysilicon avalanche diode, having an anode as said first terminal and a cathode as said second terminal.

7. The DRAM memory device of claim 5 wherein each of said first diodes is a polysilicon avalanche diode, having a cathode as said first terminal and an anode as said second terminal.

8. The DRAM memory device of claim 5 wherein one of said plurality of capacitors in each first line is a reference capacitor, and further comprising:

a precharging circuit connecting one of said first address lines to a precharge voltage, and another of said first address lines to said precharge voltage; and a differential sensing circuit for sensing the charges on said one first address line and the charges on said another first address line;

wherein said second address decoder and said first address decoder are adapted to select a capacitor connected to said one first address line, and to select a reference capacitor connected to said another first address line.

9. The DRAM memory device of claim 5 further comprising:

a plurality of third address lines, each of said third address lines having an associated first address line; and wherein said plurality of capacitors arranged in the same first line have the same associated first and third address lines and with the capacitors in the same second line having the same associated second address line;

a plurality of second diodes, each second diode having a third terminal and a fourth terminal, with said third terminal connected to the first electrical connection of one of said plurality of capacitors, and said fourth terminal connected to an associated third address line; and wherein said first address decoder further connected to said plurality of third address lines adapted to select one of said third address lines.

10. The DRAM memory device of claim 9, wherein each of said plurality of first address lines associated with the capacitors arranged in the same first line is substantially parallel to the associated third address line associated with the same capacitors arranged in the same first line; and wherein said first address decoder selects a first address line and said second address decoder selects a second address line for storing a first charge on a capacitor associated with said first address line and said second address line; and wherein said first address decoder selects a third address line, associated with said first address line, and said second address decoder selects said second address line for storing a second charge on said capacitor.

11. The DRAM memory device of claim 10 wherein each of said first diodes is a PN junction, polysilicon diode having a first anode as said first terminal and a first cathode as said second terminal; and wherein each of said second diodes is a PN junction diode, polysilicon diode having a second anode as said third terminal and a second cathode as said fourth terminal.

12. The DRAM memory device of claim 11 wherein one of said plurality of capacitors in each first line is a reference capacitor; and further comprising:

a precharging circuit connecting one of said first address lines to a precharge voltage, and another of said first address lines to said precharge voltage; and a differential sensing circuit adapted to sense the charges on said one first address line and the charges on said another first address line;

wherein said second address decoder and said first address decoder selects a capacitor connected to said one first address line, and selects a reference capacitor connected to said another first address line.

13. A method of minimizing write disturbance on a select storage cell of a memory device during a write operation to one state, said memory device having a plurality of first address lines, a plurality of second address lines, a plurality of storage cells, arranged in a plurality of first lines and second lines, each of said plurality of storage cells having a first electrical connection and a second electrical connection; wherein each of the storage cells arranged in the same first line has the same associated first address line, and wherein each of the storage cells arranged in the same second line has the same associated second address line, with the second electrical connection of each of the storage cells connected thereto; a plurality of diodes, each diode having an anode terminal and a cathode terminal, with said anode terminal of one of said plurality of diodes connected to the first electrical connection of said select storage cell, and said cathode terminal of said one diode connected to an associated first address line; a first address decoder connected to said plurality of first address lines for selecting one of said first address lines; a second address decoder for selecting one of said plurality of second address lines; said method comprising:

applying a first voltage to a select one of said plurality of first address lines;

applying a second voltage to a select one of said second address lines, thereby selecting said select storage cell defined by said one first address line, and said one second address line to write said select storage cell to said one state; and applying said first voltage to all of said second address lines, other than said one second address line.

14. The method of claim 13 further comprising:

applying said second voltage to all of said plurality of first address lines, other than said select one first address line.

15. A method of minimizing write disturbance on a select storage cell of a memory device during a write operation to one state, said memory device having a plurality of first address lines, a plurality of second address lines, a plurality of storage cells, arranged in a plurality of first lines and second lines, each of said plurality of storage cells having a first electrical connection and a second electrical connection; wherein each of the storage cells arranged in the same first line has the same associated first address line, and wherein each of the storage cells arranged in the same second line has the same associated second address line, with the second electrical connection of each of the storage cells connected thereto; a plurality of diodes, each diode having an anode terminal and a cathode terminal, with said cathode terminal of one of said plurality of diodes connected to the first electrical connection of said select storage cell, and said anode terminal of said one diode connected to an associated first address line; a first address decoder connected to said plurality of first address lines for selecting one of said first address lines; a second address decoder for selecting one of said plurality of second address lines; said method comprising:

applying a first voltage to a select one of said plurality of first address lines;

applying a second voltage to a select one of said second address lines, thereby selecting said select storage cell defined by said one first address line, and said one second address line to write said select storage cell to said one state; and applying a third voltage, more positive than said second voltage to all of said second address lines, other than said one second address line.

16. A method of writing a select capacitor of a DRAM memory device to one state or another state, said DRAM memory device having a plurality of first address lines, a plurality of second address lines, a plurality of third address lines, a plurality of capacitors, arranged in a plurality of first and second lines, each of said plurality of capacitors having a first electrical connection and a second electrical connection; wherein each of the capacitors arranged in the same first line has the same associated first address line and the same associated second address line, and wherein each of the capacitors arranged in the same second line has the same associated third address line, with the second electrical connection of each of the capacitors connected thereto; a plurality of first diodes, each first diode having a first anode and a first cathode, with said first cathode of one of said plurality of first diodes connected to the first electrical connection of said select capacitor, and said first anode of said one first associated fed to an associated first address line; a plurality of second diodes, each second diode having a second anode and a second cathode, with said second anode of one of said plurality of second diodes connected to the first electrical connection of said select capacitor, and said second cathode of said one second diode connected to an associated second address line; first address decoder connected to said plurality of first and second address lines for selecting one of said first or second address lines; and second address decoder connected to said plurality of third address for selecting one of said plurality of third address lines; said method comprising:

writing said select capacitor to one state by:
applying a first voltage to a select one of said plurality of first address lines;
applying a second voltage to a select one of said third address lines, thereby selecting said select capacitor defined by said one first address line, and said one third address line, to write said select capacitor to one state;

writing said select capacitor to another state by:
applying a third voltage to a select one of said plurality of second address lines, said select one second address line associated with said select one first address line;
applying a fourth voltage to said select one third address line.

17. A method of reading a select capacitor of a DRAM memory device, written to a state by having a voltage stored on said select capacitor, said DRAM memory device having a plurality of first address lines, a plurality of second address lines, a plurality of capacitors, each capacitor having a first capacitance, said plurality of capacitors arranged in a plurality of first and second lines, each of said plurality of capacitors having a first electrical connection and a second electrical connection; wherein each of the capacitors capacitor arranged in the same first line has the same associated first address line, and wherein each of the capacitors arranged in the same second line has the same associated second address line, with the second electrical connection of each of the capacitors connected thereto; a plurality of diodes, each diode having a first terminal and a second terminal, with said first terminal connected to the first electrical connection, and said second terminal connected to an associated first address line; first address decoder for selecting one of said first address lines; second address decoder for selecting one of said plurality of second address lines, said method comprising:

applying a first voltage to all of said plurality of second address lines; while precharging one of said plurality of first address lines to a second voltage and another of said plurality of first address lines to said second voltage;

changing said first voltage to a third voltage of one of said plurality of second address lines thereby selecting said select capacitor defined by said one second address line and said one first address line, for a first period of time;

changing said third voltage to a fourth voltage of said one second address line, for a second period of time, after said first period of time;

differentially sensing the charge on said one first address line and said another first address line, after said second period of time, to determine the state of said select capacitor.

18. The method of claim 17 wherein said fourth voltage is greater than said third voltage, and wherein said third voltage is less than said first voltage.

19. The method of claim 17 wherein said fourth voltage is less than said third voltage, and wherein said third voltage is greater than said first voltage.

20. A method of reading a select capacitor of a DRAM memory device, written to a state by having a voltage stored on said select capacitor, said DRAM memory device having a plurality of first address lines, a plurality of second address lines, a plurality of capacitors, each capacitor having a first capacitance, said plurality of capacitors arranged in a plurality of first and second lines with a reference capacitor in each first line, said reference capacitor having a second capacitance different from said first capacitance, each of said plurality of capacitors and reference capacitors having a first electrical connection and a second electrical connection; wherein each of the capacitors and reference capacitor arranged in the same first line has the same associated first address line, and wherein each of the capacitors and reference capacitor arranged in the same second line has the same associated second address line, with the second electrical connection of each of the capacitors and reference capacitor connected thereto; a plurality of diodes, each diode having a first terminal and a second terminal, with said first terminal connected to the first electrical connection, and said second terminal connected to an associated first address line; first address decoder for selecting one of said first address lines; second address decoder for selecting one of said plurality of second address lines, said method comprising:

applying a first voltage to all of said plurality of second address lines; while precharging one of said plurality of first address lines to a second voltage and another of said plurality of first address lines to said second voltage;

changing said first voltage to a third voltage of one of said plurality of second address lines thereby selecting said select capacitor defined by said one second address line and said one first address line;

simultaneously changing said first voltage to a third voltage of another of said plurality of second address lines thereby selecting a select reference capacitor defined by said another second address line and said another first address line;

differentially sensing the charge on said one first address line and said another first address line to determine the state of said select capacitor.

* * * * *